United States Patent [19]

Yapel et al.

[11] Patent Number: 5,906,862
[45] Date of Patent: May 25, 1999

[54] APPARATUS AND METHOD FOR DRYING A COATING ON A SUBSTRATE

[75] Inventors: Robert A. Yapel, Oakdale; Omar D. Brown, St. Paul, both of Minn.; Wayne P. Ray, Weatherford, Okla.; Daniel V. Norton, St. Paul, Minn.; Bernard A. Scheller, Roseville, Minn.; Manley C. Marcellus, Lake Elmo, Minn.

[73] Assignee: Minnesota Mining and Manufacturing Company, St. Paul, Minn.

[21] Appl. No.: 08/831,248

[22] Filed: Apr. 2, 1997

[51] Int. Cl.$^6$ ................................ B05D 3/04; B05D 3/02
[52] U.S. Cl. ...................... 427/378; 427/372.2; 427/379; 427/381; 427/382; 118/65; 118/67; 34/421; 34/423; 34/463; 34/488; 34/492; 34/501; 34/503; 34/504; 34/506
[58] Field of Search ................................ 427/372.2, 378, 427/379, 381, 382; 118/65, 67; 34/420, 421, 423, 447, 451, 461, 488, 492, 501, 503, 504, 506, 210, 215, 242, 639, 629, 463

[56] References Cited

U.S. PATENT DOCUMENTS

| 3,231,985 | 2/1966 | Smith, Jr. | 34/451 |
| 3,383,239 | 5/1968 | Christman, Jr. | 118/67 |
| 3,405,020 | 10/1968 | Chavannes | 427/378 |
| 3,494,048 | 2/1970 | Du Fresne | 34/23 |

(List continued on next page.)

FOREIGN PATENT DOCUMENTS

| 236 186 | 5/1986 | Germany | F26B 21/00 |
| 43 16 402 | 11/1994 | Germany | B05D 5/00 |
| 620 766 | 8/1978 | U.S.S.R. | F26B 3/02 |
| 1 276 889 | 12/1986 | U.S.S.R. | F26B 21/10 |

OTHER PUBLICATIONS

R. Aust, "Prevention of Coating Defects due to the Drying of Highly Volatile Solvents (Phase I)", pp. 1–56 (Nov. 9, 1992).
E. Cohen et al., "A Primer on Forming Coatings", *Chemical Engineering Progress*, pp. 30–36 (Sep. 1990).
E. Cohen, "Thin Film Drying", *Modern Coating and Drying Technology*, Chapter 7, VCH Publishers, NY, 1992, pp. 267–298.
C. Hansen et al., "Cellular Convection in Polymer Coatings—An Assessment", *Ind. Eng. Chem. Prod. Res. Develop.*, 12(1), pp. 67–69 (1973).
L.E. Scriven et al., "Take a Closer Look at Coating Problems", *Chemical Engineering Progress*, pp. 24–29 (Sep. 1990).
H.G. Wagner et al., "Performance Study of a Laminar Flow Dryer for Applications In Film Coating", Published Paper from the University of Erlangen–Nürnberg, pp. 182–189.

*Primary Examiner*—Shrive Beck
*Assistant Examiner*—Michael Barr
*Attorney, Agent, or Firm*—William K. Weimer

[57] ABSTRACT

A method and apparatus for coating and drying coated substrates without introducing significant surface imperfections while running at higher web speeds than known drying methods. The substrate is preferably coated within the drying enclosure or the coating bead may form a closure at the entrance of the drying enclosure. The substrate is moved through a first drying enclosure along a first axis. The first drying enclosure is substantially isolated from an external environment. A first low velocity, substantially laminar flow field of a drying gas is directed across the front surface of the substrate. The first flow field is generally parallel to the front surface and generally perpendicular to the first axis to minimize the formation of surface imperfections during the evaporation of the coating solvent. The substrate may then be moved to subsequent drying enclosures through transition enclosures that minimize surface imperfections due to high velocity interaction between the adjacent drying enclosures. In embodiments where the first axis is in an inclined configuration with respect to horizontal, louvers may be utilized for directing solvent evolving from the substrate to minimize surface imperfections due to solvent cascade.

27 Claims, 20 Drawing Sheets

U.S. PATENT DOCUMENTS

| | | | |
|---|---|---|---|
| 3,648,383 | 3/1972 | Saunders | 34/242 |
| 3,849,904 | 11/1974 | Villalobos | 34/155 |
| 4,023,472 | 5/1977 | Grunder et al. | 98/40 D |
| 4,051,278 | 9/1977 | Democh | 427/326 |
| 4,260,673 | 4/1981 | Krech | 430/143 |
| 4,306,358 | 12/1981 | King, Jr. | 34/23 |
| 4,365,423 | 12/1982 | Arter et al. | 34/23 |
| 4,497,121 | 2/1985 | Choinski | 34/23 |
| 4,569,658 | 2/1986 | Wiggins et al. | 432/47 |
| 4,594,266 | 6/1986 | Lamaire et al. | 427/55 |
| 4,634,840 | 1/1987 | Yamagishi et al. | 219/388 |
| 4,698,914 | 10/1987 | Shu et al. | 34/10 |
| 4,843,731 | 7/1989 | Vits | 34/10 |
| 4,872,270 | 10/1989 | Fronheiser et al. | 34/23 |
| 4,889,787 | 12/1989 | Musser | 430/166 |
| 4,894,927 | 1/1990 | Ogawa et al. | 34/32 |
| 4,999,927 | 3/1991 | Durst et al. | 34/23 |
| 5,001,845 | 3/1991 | Norz et al. | 34/16 |
| 5,010,659 | 4/1991 | Treleven | 34/41 |
| 5,032,493 | 7/1991 | Mori et al. | 430/353 |
| 5,060,396 | 10/1991 | Hansen | 34/16 |
| 5,077,912 | 1/1992 | Ogawa et al. | 34/33 |
| 5,136,790 | 8/1992 | Hagen et al. | 34/23 |
| 5,147,690 | 9/1992 | Faust et al. | 427/372.2 |
| 5,230,165 | 7/1993 | Beisswanger | 34/60 |
| 5,270,378 | 12/1993 | Johnson et al. | 524/520 |
| 5,298,292 | 3/1994 | Dilko et al. | 427/543 |
| 5,394,622 | 3/1995 | Evans et al. | 34/494 |
| 5,433,973 | 7/1995 | Wallack et al. | 427/128 |

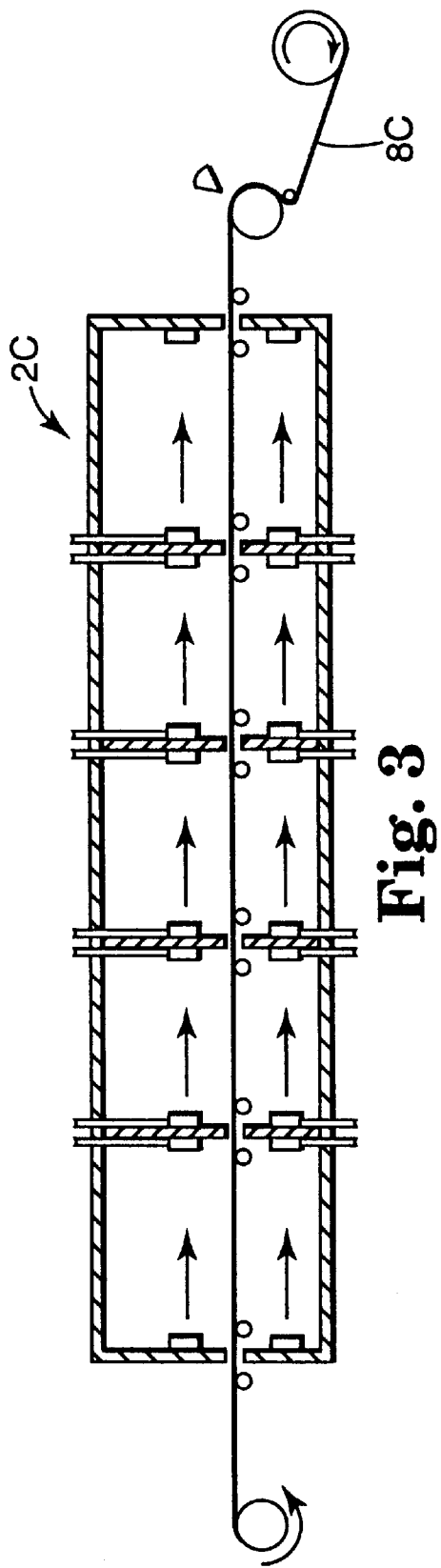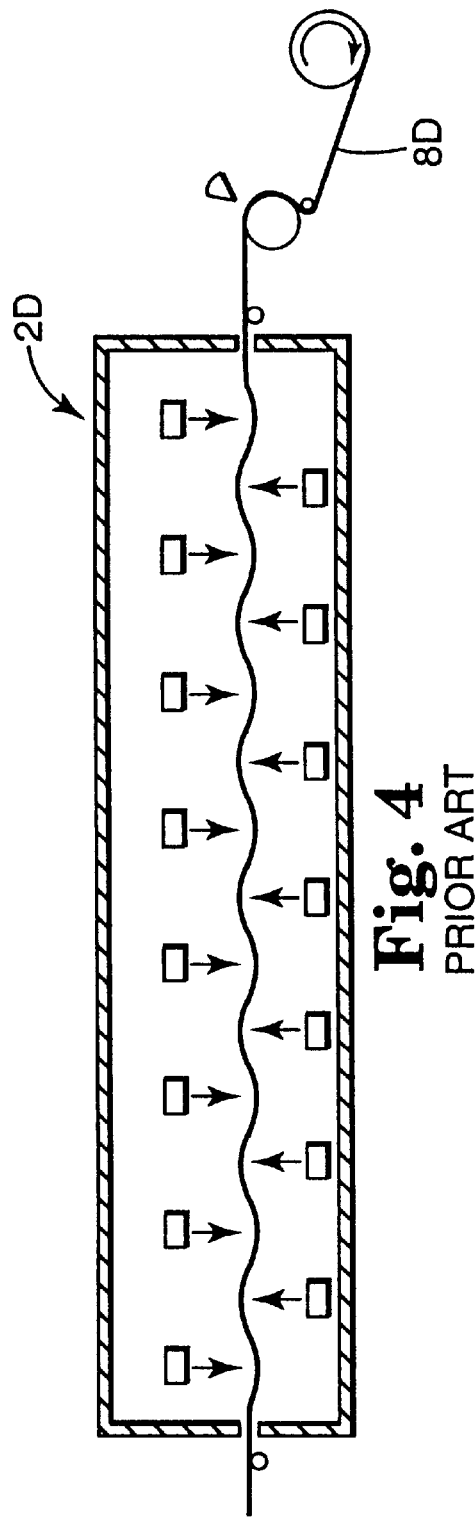
Fig. 3 PRIOR ART
Fig. 4 PRIOR ART

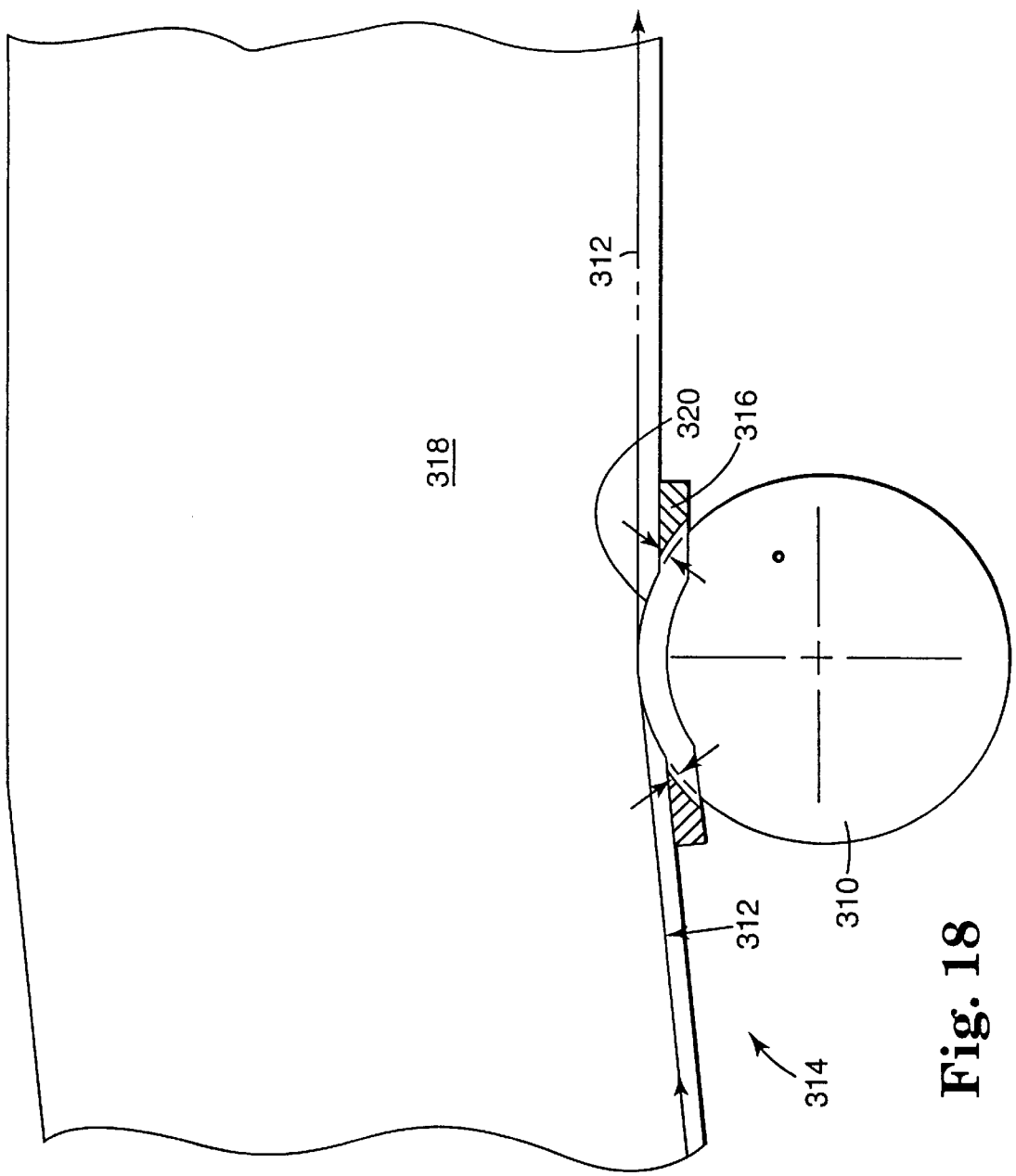

APPARATUS AND METHOD FOR DRYING A COATING ON A SUBSTRATE

FIELD OF THE INVENTION

The present invention relates to a method and apparatus for drying coatings on a substrate and more particularly to drying coatings used in making imaging articles, data storage media and the like.

BACKGROUND OF THE INVENTION

The production of high quality articles, particularly photographic, photothermographic, and thermographic articles, consists of applying a thin film of coating solution onto a continuously moving substrate. Thin films can be applied using a variety of techniques including: dip coating, forward or reverse roll coating, wire-wound coating, blade coating, slot coating, slide coating, and curtain coating (see for example L. E. Scriven; W. J. Suszynski; *Chem. Eng. Prog.* 1990, September, p. 24). Coatings can be applied as single layers or as two or more superposed layers. While it is usually most convenient for the substrate to be in the form of a continuous substrate, it can also be in the form of a succession of discrete sheets.

The initial coating is either a mixture of solvent and solids or a solution and must be dried to obtain the final dried article. While the cost of a coating process is determined by the coating technique, the cost of a drying process is often proportional to the desired line speed (see E. D. Cohen; E. J. Lightfoot; E. B. Gutoff; *Chem. Eng. Prog.* 1990, September, p. 30). The line speed is limited by the capabilities of the oven. To reduce costs, it is desirable that the removal of solvent from the coating be as efficient as possible. This is generally accomplished by transferring heat to the coated article as efficiently as possible. This is often accomplished by increasing the velocity of the drying gas at the coating surface, thereby increasing heat transfer and solvent evaporation and thus drying the coating more quickly. The resulting turbulent air, however, increases the tendency for defect formation.

The process of applying a coating to and drying that coating on a substrate can inherently create defects, including Benard cells, orange peel, and mottle. Benard cells are defects arising from circulatory motion within the coating after it has been applied (see C. M. Hanson; P. E. Pierce; *Cellular Convection in Polymer Coatings—An Assessment*, 12 Ind. Eng. Chem. Prod. Res. Develop. 1973, p. 67).

Orange peel is related to Benard cells. Orange peel is most common in liquid coatings which have a high viscosity to solids ratio. This is due to the tendency of such systems to "freeze in" the topography associated with Benard cells upon loss of relatively small amounts of solvent. The topography can be observed as a small scale pattern of fine spots like the surface of an orange peel. The scale of the pattern is on the order of millimeters and smaller.

Mottle is an irregular pattern or non-uniform density defect that appears blotchy when viewed. This blotchiness can be gross or subtle. The pattern may even take on an orientation in one direction. The scale can be quite small or quite large and may be on the order of centimeters. Blotches may appear to be different colors or shades of color. In black-and-white imaging materials, blotches are generally shades of gray and may not be apparent in unprocessed articles but become apparent upon development. Mottle is usually caused by air movement over the coating before it enters the dryer, as it enters the dryer, or in the dryer (see for example, "*Modern Coating and Drying Technology*," Eds. E. D. Cohen, E. B. Gutoff, VCH Publishers, NY, 1992; p. 288).

Mottle is a problem that is encountered under a wide variety of conditions. For example, mottle is frequently encountered when coatings comprising solutions of a polymeric resin in an organic solvent are coated onto webs or sheets of synthetic organic polymer substrates. Mottle is an especially severe problem when the coating solution contains a volatile organic solvent but can also occur to a significant extent even with aqueous coating compositions or with coating compositions using an organic solvent of low volatility. Mottle is an undesirable defect because it detracts from the appearance of the finished product. In some instances, such as in imaging articles, it is further undesirable because it adversely affects the functioning of the coated article.

Substrates that have been coated are often dried using a drying oven which contains a drying gas. The drying gas, usually air, is heated to a suitable elevated temperature and brought into contact with the coating in order to bring about evaporation of the solvent. The drying gas can be introduced into the drying oven in a variety of ways. Typically, the drying gas is directed in a manner which distributes it uniformly over the surface of the coating under carefully controlled conditions that are designed to result in a minimum amount of disturbance of the coated layer. The spent drying gas, that is, drying gas which has become laden with solvent vapor evaporated from the coating, is continuously discharged from the dryer.

Many industrial dryers use a number of individually isolated zones to allow for flexibility in drying characteristics along the drying path. For example, U.S. Pat. No. 5,060,396 describes a zoned cylindrical dryer for removing solvents from a traveling substrate. The multiple drying zones are physically separated, and each drying zone may operate at a different temperature and pressure. Multiple drying zones are desirable because they permit the use of successively lower solvent vapor composition. German Pat. No. DD 236,186 describes the control of humidity and temperature of each drying zone to effect maximum drying at minimum cost. Soviet Pat. No. SU 620,766 describes a multistage timber dryer with staged temperature increases that reduce the stress within the timber.

Usually, when multiple zones are present in an oven, they are isolated from one another. The coated substrate is transferred between the zones through a slot. In order to minimize the air and heat flow between zones and to be able to effectively control the drying conditions in each zone, this slot typically has as a cross-section on the order of about 2.54 cm to about 10.16 cm so as to allow the substrate to pass between zones. However, the adjacent zones are in communication with one another through the slot and thus there is typically a pressure difference between zones. Air flows from one zone to another; and since the dimensions of the slot are small, the air gas velocity is high. Therefore the slots between ovens tend to be sources for mottle defects.

U.S. Pat. No. 4,365,423 discloses an apparatus and method for drying to reduce mottle. FIG. 1 shows an embodiment of this invention. The drying apparatus 2A uses a foraminous shield 4A to protect the liquid coating 6A from air disturbances. The foraminous shield 4A is described to be a screen or perforated plate that sets up a "quiescent" zone above the substrate promoting uniform heat and mass transfer conditions. The shield 4A is also noted to restrict the extent to which spent drying gas, which is impinged toward the liquid coating 6A, comes in contact with the surface of the coating, thereby reducing the inherent turbulent airflow in the oven that tends to cause mottle. This method is reported to be especially advantageous in drying photographic materials, particularly those comprising one or more layers formed from coating compositions that contain volatile organic solvents. This apparatus and method has the limitation that it slows the rate of drying.

U.S. Pat. No. 4,999,927 discloses another apparatus and method for drying a liquid layer that has been applied to a carrier material moving through a drying zone and which contains both vaporizable solvent components and non-vaporizable components. FIG. 2 illustrates this apparatus 2B and method. Drying gas flows in the direction of the carrier material 8B and is accelerated within the drying zone in the direction of flow. In this manner, laminar flow of the boundary layer of the drying gas adjacent to the liquid layer on the carrier material is maintained to reduce mottle.

Examples of two other known drying apparatuses and methods are shown in FIGS. 3 and 4. FIG. 3 schematically shows a known drying apparatus 2C in which air flows (see arrows) from one end of an enclosure to the other end. The airflow is shown in FIG. 3 as being parallel and counter to the direction of travel of the coated substrate (i.e., counter-current). Parallel concurrent airflow is also known.

FIG. 4 schematically shows a known drying apparatus 2D which involves the creation of impingement airflow (see arrows), that is more perpendicular to the plane of the substrate 8D. The impinging air also acts as a means for floating or supporting the substrate through the oven.

U.S. Pat. No. 4,051,278 describes a method for reducing mottle caused by solvent evaporation in the coating zone. Coating a substrate with reduced mottle, such as coating a composition comprising a film-forming material in an evaporable liquid vehicle onto a flexible web or synthetic organic polymer, is achieved by maintaining at least two of the following at a temperature substantially equivalent to the equilibrium surface temperature of the coated layer at the coating zone: (1) the temperature of the atmosphere at the location of coating; (2) the temperature of the coating composition at the location of coating; and (3) the temperature of the substrate at the coating zone. The equilibrium surface temperature is defined as the temperature assumed by the surface of a layer of the coating composition under steady state conditions of heat transfer following evaporative cooling of the layer at the coating zone. After coating, drying of the coated layer is carried out by conventional techniques. This invention includes methods of drying while preventing mottle formation by controlling temperature (i.e., by cooling) at the coating zone and does not address temperature control or mottle formation within the drying oven. Furthermore, this method would be useful only for coatings that cool significantly due to evaporative cooling which subsequently causes mottle.

U.S. Pat. No. 4,872,270 describes a method of drying latex paint containing water and one or more high boiling organic solvents coated onto a carrier film. The process yields a dried paint layer free of blisters and bubble defects. The coated film is passed continuously through a series of at least three drying stages in contact with warm, moderately humid air and more than half of the heat required for evaporation is supplied to the underside of the film. Drying conditions in at least each of the first three stages are controlled to maintain a film temperature profile which causes the water to evaporate at a moderate rate but more rapidly than the organic solvents, thus achieving coalescence of the paint and avoiding the trapping of liquids in a surface-hardened paint layer. Bubble formation is reportedly eliminated by controlling the vapor pressure of the volatile solvent within the film. The formation of mottle occurs due to a different mechanism than blisters and requires different methods for control and elimination.

U.S. Pat. No. 4,894,927 describes a process for drying a moving web coated with a coating composition containing a flammable organic solvent. The web is passed through a closed-type oven filled with an inert gas and planer heaters on top and bottom of the web. The coating surface is reported to be barely affected by movement of the inert drying gases due to the small amounts of gas required. No discussion of the criticality of the gas flow system or of the need to prevent mottle is given.

U.S. Pat. No. 5,077,912 describes a process for drying a continuously traveling web coated with a coating composition containing an organic solvent. The coating is first dried using hot air until the coating is set-to-touch. It is sufficient that the drying conditions, such as temperature and hot air velocity, are adjusted so as to obtain the set-to-touch condition. Set-to-touch corresponds to a viscosity of $10^8$ to $10^{10}$ poise. Residual solvent is then removed using a heated roll. This method is said to reduce drying defects, decrease drying time, and reduce oven size. No discussion on the construction of the oven, methods of drying, or the criticality of the gas flow system and path is given.

U.S. Pat. No. 5,147,690 describes a process and apparatus for drying a liquid film on a substrate which includes a lower gas or air supply system and an upper gas or air supply system. Heated gas on the underside of the substrate forms a carrying cushion for the substrate and at the same time supplies drying energy to the substrate. The exhaust air is carried away through return channels. Slots for the gas supply and return are arranged alternately in the lower gas system. The upper gas or air supply system has a greater width than the lower gas or air supply system. In the upper gas or air supply system, the supply air or gas is diverted by baffles onto the substrate and returned over the substrate web as return air or gas. The upper gas or air supply system is subdivided into sections for the supply air and exhaust air, each section includes two filter plates of porous material. This arrangement, however, still impinges air on the coated web, which can lead to uncontrolled turbulent air flow and mottle.

U. S. Pat. No. 5,433,973 discloses a method of coating a magnetic recording media onto a substrate, wherein the coating is substantially free of Benard cells. The method comprises the steps of: (a) providing a dispersion comprising a polymeric binder, a pigment, and a solvent; (b) coating the dispersion onto the surface of a substrate; (c) drying the dispersion; (d) calculating values comprising $\mu$, $\beta$, and d representing the viscosity, temperature gradient, and wet caliper of the dispersion respectively; and (e) during the course of carrying out steps (a), (b), and (c), maintaining the ratio $$\frac{\beta d^2}{\mu}$$

below a threshold value sufficient to substantially prevent the formation of Benard Cells in the magnetic recording media coating. No discussion of the interior of the drying oven and arrangement of air inlets and exhausts is given.

A number of methods involve the control of the drying gas within the oven. For example, U.S. Pat. No. 5,001,845 describes a control system for an industrial dryer used to remove a flammable solvent or vapors from a traveling web of material. Sensors within each zone measure the oxygen content of the pressurized atmosphere. If the oxygen content exceeds a given limit, an inert gas is added. At the same time, the pressure is maintained within the oven body by releasing excess gas to the atmosphere.

U.S. Pat. No. 5,136,790 describes a method and apparatus for drying a continuously moving web carrying a liquid, wherein the web is passed through a dryer in which the web is exposed to a recirculating flow of heated drying gas. Exhaust gas is diverted and discharged from the recirculating gas flow at a gas velocity which is variable between maximum and minimum levels, and makeup gas is added to the recirculating gas flow at a gas velocity which is also variable between maximum and minimum levels. A process variable is sensed and compared to a selected set point. A first of the aforesaid flow rates is adjusted to maintain the process variable at the selected set point, and a second of the aforesaid flow rates is adjusted in response to adjustments to the first drying gas velocity in order to insure that the first drying gas velocity remains between its maximum and minimum levels. No discussion of the interior of the drying oven and arrangement of air inlets and exhausts is given.

Soviet Pat. No. SU 1,276,889 describes a method for controlling drying gas by controlling the air gas velocity within the oven. In this method, fan speed in one zone is adjusted, controlling the air flow rate, in order to maintain the web temperature at the outlet to a specified temperature. This approach is limited in that increasing the air gas velocity in order to meet a drying specification can lead to mottle.

The physical state of the drying web can also be used to control the drying ovens. For example, in Soviet Pat. No. SU 1,276,889, noted above, the temperature of the web at the outlet of the oven was used to set the air flow rate.

U.S. Pat. No. 5,010,659 describes an infrared drying system for monitoring the temperature, moisture content, or other physical property at particular zone positions along the width of a traveling web, and utilizing a computer control system to energize and control for finite time periods a plurality of infrared lamps for equalizing physical property and drying the web. The infrared drying system is particularly useful in the graphic arts industry, the coating industry and the paper industry, as well as any other applications requiring physical property profiling and drying of the width of a traveling web of material. No discussion of the interior of the drying oven and arrangement of air inlets and exhausts is given.

U.S. Pat. No. 4,634,840 describes a method for controlling the drying temperature in an oven used for heat-treating thermoplastic sheets and films. A broad and continuous sheet or film is uniformly heated in a highly precise manner and with a specific heat profile by using a plurality of radiation heating furnaces, wherein in the interior of each radiation heating furnace, a plurality of rows of heaters are arranged rectangularly to the direction of delivery of the sheet or film to be heated. A thermometer for measuring the temperature of the sheet or film is arranged in the vicinity of an outlet for the sheet or film outside each radiation heating furnace. Outputs of heaters arranged within the radiation heating furnaces located just before the respective thermometers are controlled based on the temperatures detected by the respective thermometers by using a computer.

Two other patents address drying problems, but fail to address the problem of mottle. U.S. Pat. No. 3,849,904 describes the use of a mechanical restriction of air flow at the edge of a web. Adjustable edge deckles are noted as forming a seal with the underside of a fabric allowing for different heating conditions to occur at the edge. This allows the edge of the fabric to be cooled while the remainder of the fabric is heated. This approach, however, is not advantageous when a polymer substrate is used. Possible scratching of the polymer substrate can generate small particulates which can be deposited on the coating. U.S. Pat. No. 3,494,048 describes the use of mechanical means to divert air flow at the edge of the web. Baffles are noted as deflecting air and preventing air from penetrating behind paper in an ink dryer and from lifting the paper from a drum. Keeping the paper on the drum prevents the drying ink from being smeared.

A need exists for a drying method and apparatus which minimizes or eliminates uncontrolled airflow that can lead to mottle, minimizes initial drying rates that can lead to orange peel and permits higher line speeds. There is also a need for a drying apparatus that minimizes mottle caused by natural convection of the evaporated solvent from the coating on an inclined web path. Additionally, there is a need for a drying method and apparatus that can isolate a series of drying zones.

BRIEF SUMMARY OF THE INVENTION

The present invention relates to a method and apparatus for coating and drying coated substrates, and particularly to dry coated substrates used in the manufacture of photothermographic, thermographic, and photographic articles without introducing significant surface imperfections while running at higher web speeds than practiced in known drying methods. The present method and apparatus may also be used for drying of coatings of adhesives, magnetic recording materials, primers, and the like.

In one embodiment, the present invention utilizes an enclosed system for coating and drying of coatings containing volatile organic solvents. The substrate is coated within the drying enclosure or the coating bead may itself form the inlet closure to the oven. The solvent vapor is removed and diluted by low-velocity laminar flow air (LVLF) moving laterally across the web. The air flow field extends over at least the coated front surface of the substrate. The present invention is particularly useful in coating and drying very low coating weight, low viscosity liquids where dilution of the coating to improve coatability makes the wet coated layer especially susceptible to objectionable surface imperfections during drying. Exemplary applications include solutions, dispersions and emulsions used in coating materials useful for color proofing, micro abrasives, construction market films, thermal transfer films, data storage materials, dry silver medical imaging, thermographic imaging and metal lithoplate coatings.

The present method for the evaporation of a coating solvent from a coating on a substrate includes applying the coating onto a front surface of the substrate. The substrate is moved through a first drying enclosure along a first axis. The first drying enclosure is substantially isolated from an external environment. A first low velocity, substantially laminar flow field of a drying gas is directed across the front surface of the substrate. The first flow field is generally parallel to the front surface and generally perpendicular to the first axis to minimize the formation of surface imperfections during the evaporation of the coating solvent. The substrate is preferably coated within the drying enclosure or the coating bead may itself form an inlet closure to the oven. The velocity of the flow field across the substrate is preferably sufficient to maintain a solvent vapor concentration at less than 25% of the lower flammability limit.

The present method may also include moving the substrate through a second drying enclosure along a second axis. The flow of drying gases between the first and second drying enclosures is preferably minimized. A second low velocity, substantially laminar flow field of a drying gas is directed across the front surface of the substrate. The second flow field being generally parallel to the front surface and generally perpendicular to the second axis to minimize the formation of surface imperfections during the evaporation of the coating solvent. In one embodiment, the velocity of the first flow field is less than the velocity of the second flow field. In another embodiment, the temperature of the drying gas in the second flow field is greater than the temperature of the drying gas in the first flow field. The substrate may be moved to subsequent drying enclosures while minimizing the flow of drying gases there between. The velocity of the flow fields is preferably progressively greater in subsequent drying enclosures.

The flow fields may be divided into a two or more parallel flow channels directed across the front surface of the substrate.

The drying enclosure may be configured so that the first axis defines an arcuate path along an outer surface of a support roll. Alternatively, the drying enclosure may be configured so that the first axis defines an inclined configuration with respect to horizontal. The evaporation of the coating solvent is preferably directed distally away from the first surface of the substrate. The drying enclosure may optionally include dividers generally perpendicular to the first axis for maintaining the flow field generally perpendicular to the first axis.

The step of directing a flow field of a drying gas includes locating a first porous media forming a surface of a supply plenum within the drying enclosure along a first edge of the substrate. The first porous media is generally parallel to the first axis and generally perpendicular to the substrate. A second porous media forming a surface of an exhaust plenum within the drying enclosure is located along a second edge of the substrate and generally parallel to the first porous substrate. The pressure within the supply plenums is increased above ambient pressure. The pressure within the exhaust plenum is preferably decreased a corresponding amount below ambient pressure. The porous media may be sintered metal or a variety of other materials. The supply and exhaust plenums may optionally be pivotally mounted within the first drying enclosure.

The present apparatus for the evaporation of a coating solvent from a coating on a substrate includes a first drying enclosure substantially isolated from an external environment. A coating device is provided for applying the coating onto a front surface of the substrate. A substrate handling system is provided for moving the substrate through the first drying enclosure along a first axis. A drying system is provided for directing a first low velocity, substantially laminar flow field of a drying gas across the front surface of the substrate. The first flow field is generally parallel to the front surface and generally perpendicular to the first axis to minimize the formation of surface imperfections during the evaporation of the coating solvent.

In an alternate embodiment, a conventional drying oven is used to substantially isolate a substrate from the external environment. A mechanism is provided for moving the substrate through the drying oven along the first axis. The first axis defines an inclined configuration with respect to horizontal. The coating solvent evaporating from the substrate is directed distally away from the first surface of the substrate. A plurality of louvers generally perpendicular to the first axis are provided for directing the coating solvent distally away from the substrate. A perforated plate may be substituted for the louvers. In another embodiment, the apparatus directs evaporating coating solvent distally away from a coated substrate may be used on a free span or exposed coated substrate.

Another embodiment of the present invention includes an apparatus for minimizing the flow of drying gases between a first drying enclosure and a second drying enclosure. The coated substrate is moved from the first drying enclosure to the second drying enclosure. A transition enclosure is located between the first drying enclosure and the second drying enclosure. The transition enclosure comprises a retractable closure plate extending across a width of the substrate and a mechanism for adjusting a gap between a distal end of the closure plate and the substrate. The retractable closure plate substantially blocks the movement of drying gases between the first and second drying enclosures. An idler roll for supporting the substrate is preferably located directly opposite the distal end of the closure plate. The distal end of the closure plate preferably has a contour generally corresponding to a contour of the substrate opposite the closure plate.

As used herein:

Emulsion layer refers to a layer of a photothermographic article that contains the photosensitive silver halide and non-photosensitive reducible silver source material; or a layer of a thermographic article that contains the non-photosensitive reducible silver source material.

Low Velocity Air Flow refers to air flow of less than about 61.5 meters/min. (200 feet/min.) and preferably less than 9.2 meter/min. (30 feet/min.). Alternatively, low velocity air flow may be defined as a velocity that is sufficient to maintain the solvent vapor concentration at less than 25% of the lower flammability limit.

Photothermographic Article refers to a construction comprising at least one photothermographic emulsion layer and any substrates, top-coat layers, image receiving layers, blocking layers, antihalation layers, subbing or priming layers, etc.

Set-to-touch or Dry-to-touch refer to a viscosity of $10^8$ to $10^{10}$ poise.

Surface Imperfections refer to mottle, Benard cells, orange peel, or other non-uniformity in the coating.

Thermographic Article refers to a construction comprising at least one thermographic emulsion layer and any substrates, top-coat layers, image receiving layers, blocking layers, antihalation layers, subbing or priming layers, etc.

Other aspects, advantages, and benefits of the present invention are disclosed and apparent from the detailed description, examples, and claims.

BRIEF DESCRIPTION OF THE SEVERAL VIEWS OF THE DRAWINGS

FIG. 3 is a side schematic view of another known drying apparatus;

FIG. 4 is a side schematic view of another known drying apparatus;

FIG. 18 is a schematic illustration of an idler roll used in the various embodiments of the drying apparatus of the present invention.

DETAILED DESCRIPTION OF THE INVENTION

Figure 1:
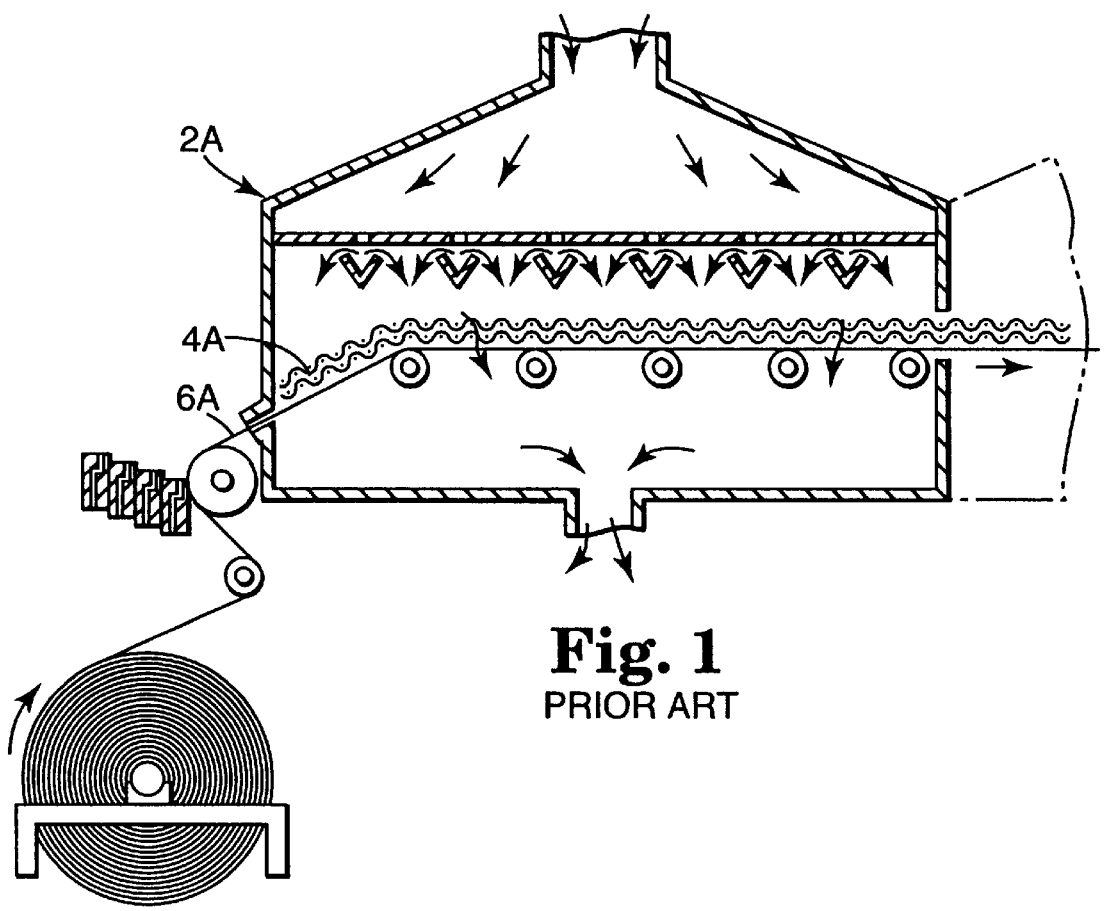
FIG. 1 is a side view of a known drying apparatus.
Figure 2:
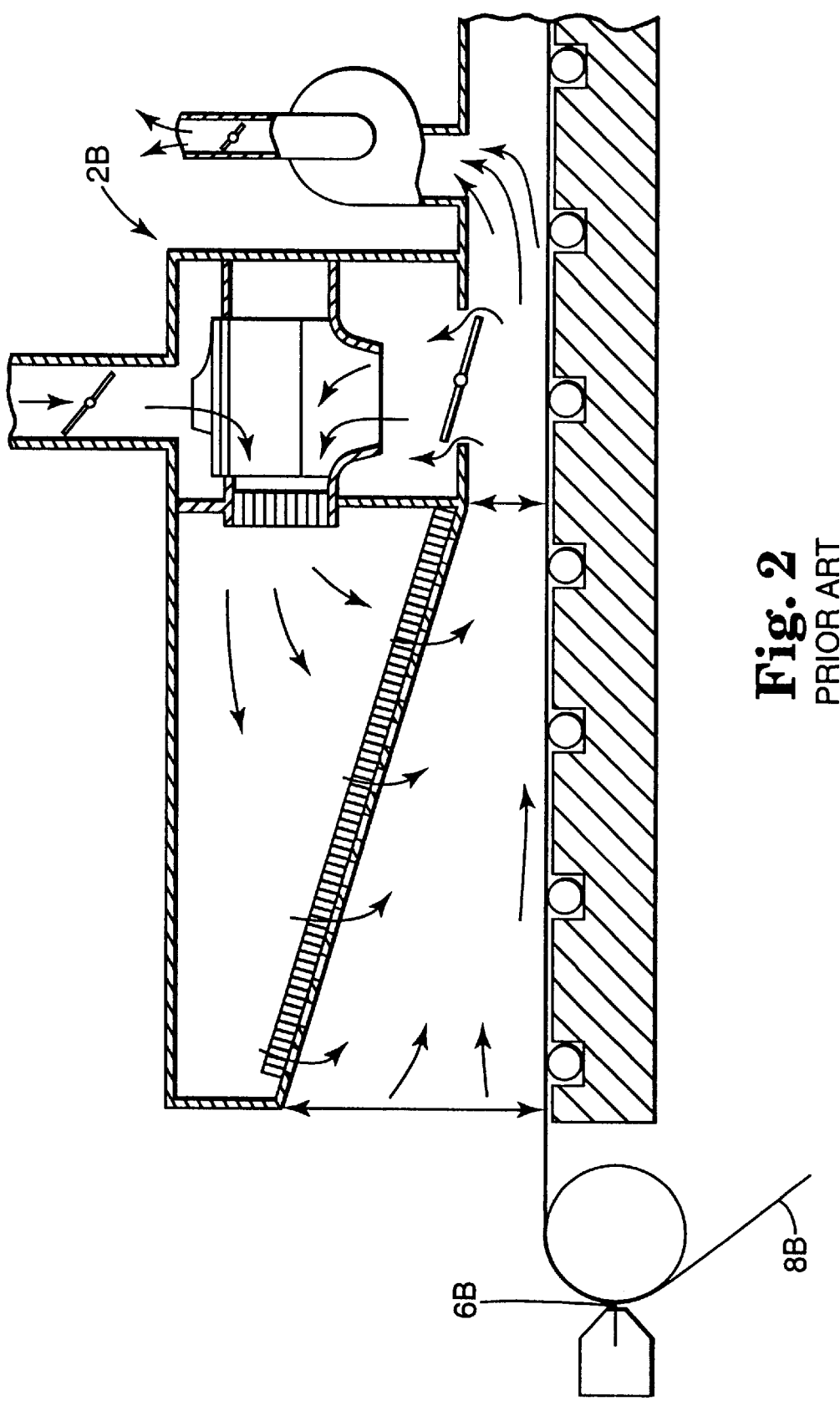
FIG. 2 is a side view of another known drying apparatus.

The present invention is directed to a method and apparatus for coating and drying coatings containing volatile solvents, where the solvent vapor is removed and diluted by low velocity laminar flow (LVLF) air directed laterally across the web, without generating objectionable surface imperfections. The air flow is transverse to the web direction and extends parallel over enough of the web surface so that sufficient solvent is evaporated and surface imperfections minimized. After the coating is dry-to-touch, the web may be subjected to turbulent air flow drying conditions without surface imperfections being created. The present invention is particularly useful for coating and drying very low coating weight, low viscosity liquids where dilution of the volatile solvent improves coatability and makes the wet coated layer especially susceptible to objectionable surface imperfections. The present invention also permits coating at higher speeds with significantly reduced surface imperfections.

It is known in the art that surface imperfections may be caused by local changes in surface tension in the coating layer due to uneven drying. Uneven drying may result from air turbulence over the coated substrate or a nonuniform temperature gradient. For example, heat transfer is typically greater at the upstream side of the flow of drying gas, resulting in a side-to-side discontinuity in drying. The surface tension variations due to turbulence or uneven drying can cause the coating liquid to move around on the web, producing an undesirable pattern. It has been found that maintaining a low-velocity laminar flow of a drying gas laterally across the moving web surface at about 21.0° C. (70° F.) can reduce or eliminate surface imperfections, even for substrate speeds of 61.5 meters/min. (200 feet/min.) or greater. Laminar flow generally refers to streamline flow of an incompressible, viscous Newtonian fluid, with all particles of the fluid moving in distinct and separate lines so that turbulence are minimized or eliminated. For purposes of this application, substantially laminar flow is sufficient.

Movement of the drying gas removes volatile solvent vapors from the drying enclosure so that the ratio of solvent vapor and air does not exceed the explosive limit. The explosive range or flammability limit refers to all concentrations of a mixture of flammable vapors in air in which a flash will occur or a flame will travel if the mixture is ignited. The lowest percentage at which flash or ignition will occur is known as the lower flammability limit (LFL) of the solvent vapor in air, usually expressed in percent by volume measured at 21.1° C. (70° F.) and normal atmospheric pressure. The LFL varies depending upon the solvent being used. For example, the LFL for methyl ethyl ketone is 1.81% volume in air. A safety margin of 25% is preferably maintained so that the volume MEK in air must be maintained below 0.45%. In the present invention, the velocity of the drying gas in the drying enclosure is preferably sufficient to maintained the concentration of the volatile solvent vapors at less than 25% of the LFL.

Figure 5:
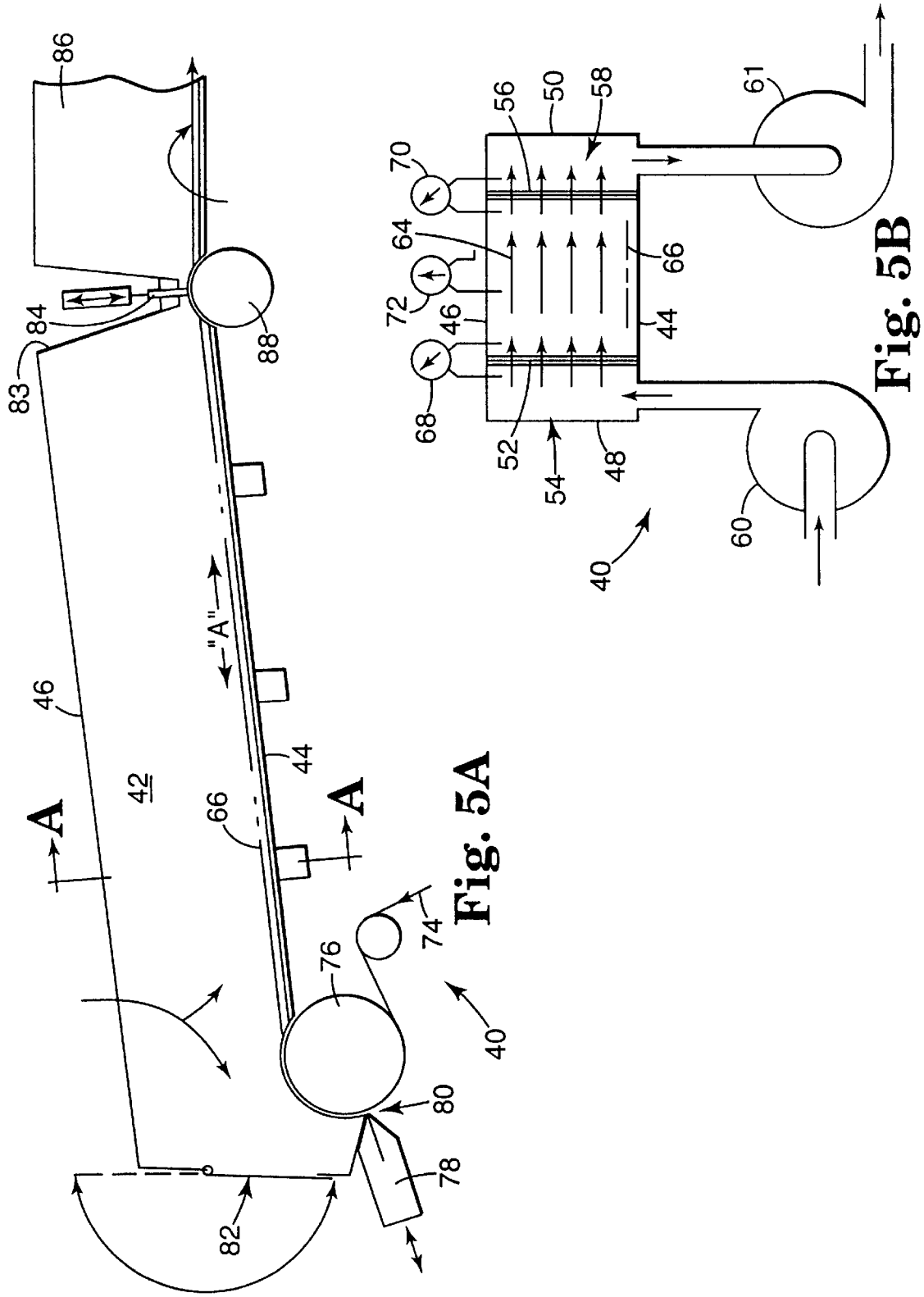
FIG. 5A is a side view of a first embodiment of a drying apparatus according to the present invention.
FIG. 5B is a sectional view of the drying apparatus of FIG. 5A.

FIGS. 5A and 5B are side views of a first embodiment of the drying apparatus 40 of the present invention. A drying enclosure 42 is formed between a bottom wall 44, a top wall 46, and a pair of opposing side walls 48, 50. A porous plate 52 is located near the side wall 48 to define a supply plenum 54. A porous plate 56 is located near side wall 50 to define an exhaust plenum 58. The porous plates 52, 56 are preferably directly opposite each other and of substantially the same size and shape. The walls 44–50 are preferably flush and no interfering plates or structures are present within the drying enclosure 42. The porous plates 52, 56 preferably extend the full distance between the opposing walls 44, 46 and access door 82 and wall 83.

A variable speed supply fan 60 is in fluid communication with the supply plenum 54. A variable speed exhaust fan 61 is in fluid communication with the exhaust plenum 58. The supply fans 60 pressurize the supply plenum 54 and the exhaust fan 61 reduces the pressure in the exhaust plenum 58 to cause substantially laminar air flow between the porous plates 52, 56. The positive pressure condition generated in the supply plenum 54 is preferably of substantially the same magnitude as the negative pressure condition created by exhaust fan 61 in the exhaust plenum 58. The porous plates 52, 56 provide generally uniform resistance to air flow so as to minimize turbulence within the drying enclosure 42.

The laminar movement of the drying gas 64 is preferably parallel to the coated surface of the coated web 66 and perpendicular to the direction of travel A of the web. The drying gas 64 may be air or an inert gas, such as argon, nitrogen, and carbon dioxide, which may be heated or cooled. Pressure gauge 68 shows a pressure drop across the porous plate 52 into the drying enclosure 42. Similarly, gauge 70 shows a pressure drop from the drying enclosure 42 to the exhaust plenum 58 of comparable magnitude. The pressure gauge 72, however, shows minimal pressure difference between the drying enclosure 42 and the outside. Consequently, the coated web 66 experiences minimal cross web variation in air flow and drying.

An uncoated web 74 is delivered to a back up roll 76 opposite a retractable coating die 78 at an entrance 80 to the drying enclosure 42. As will be discussed below, the exchange of environmental air and drying gas 64 is minimized at the entrance 80. An access door 82 is preferably provided adjacent to the entrance 80 for monitoring the coating process. The coated web 66 proceeds along a first axis A through the drying enclosure 42 to a transition enclosure 84 at the entrance to a second drying enclosure 86. The coated web 66 is supported by an idler roll 88 through the transition enclosure 84. The transition enclosure minimizes the flow of drying gases 64 between the first and second drying enclosures 42, 86 and the exchange of environmental air and the drying gas 64.

Figure 6:
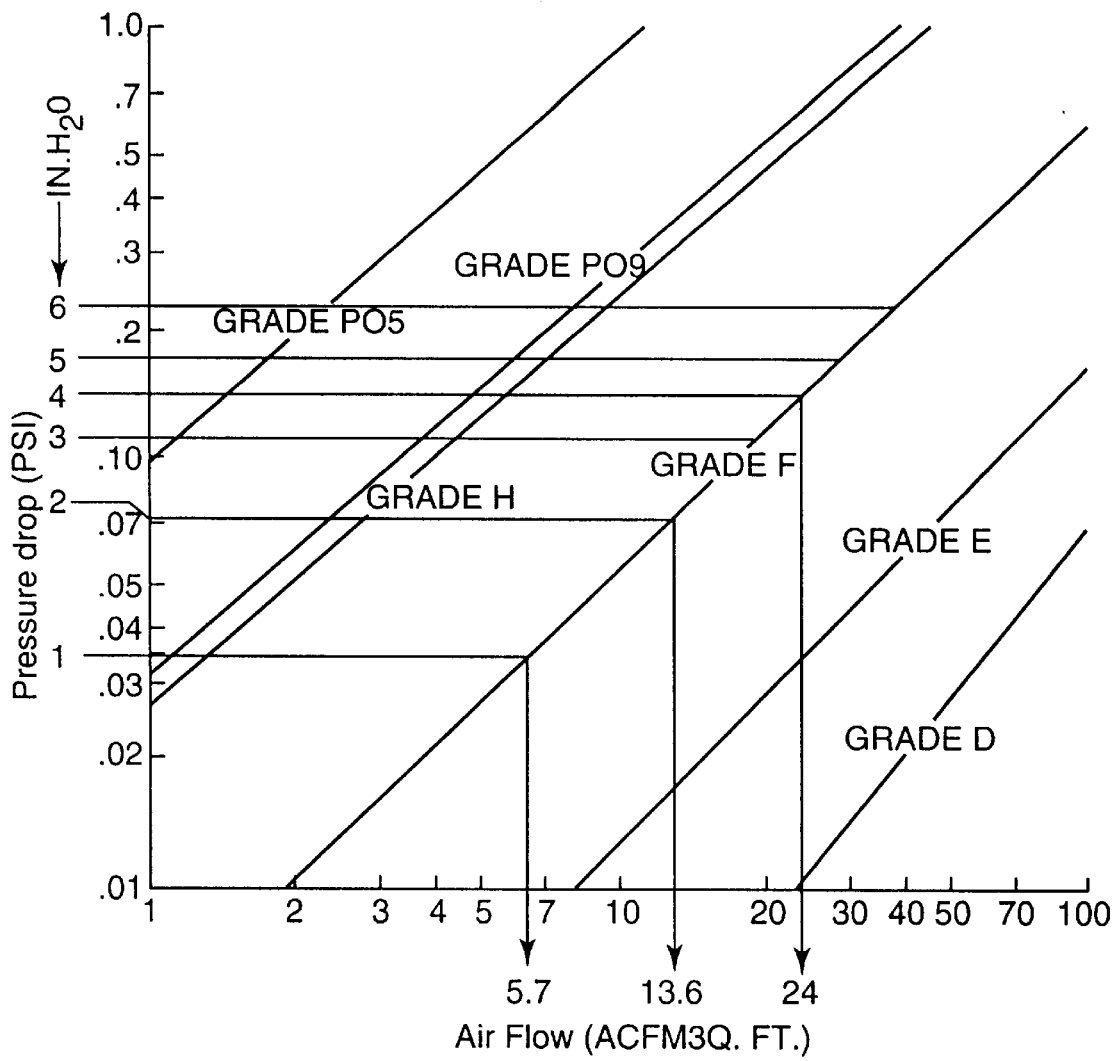
FIG. 6 is a graphic illustration of air flow versus pressure drop through sintered stainless steel plates.

The porous plates 52, 56 may be constructed from a variety of materials, such as sintered metal, sintered plastic or ceramic, paper or synthetic filter media, screens, perforated plates or any combination thereof to produce generally uniform resistance to airflow necessary for laminar air flow. FIG. 6 is a graphic illustration of the air flow vs. pressure drop through nominal 1.59 mm (0.0625 inch) thick sintered stainless steel, available from Pall Process Filtration Corp. of East Hills, N.Y. The Grade F sintered stainless steel is preferred because it provides an air flow rate through the porous plates 52, 56 of about 37.1 liters per second/m$^2$ (7.3 cubic feet per minute/ft$^2$) to about 203.2 liters per second/m$^2$ (40.0 cubic feet per minute/ft$^2$) at static plenum pressures of about 249.1 Pa (1.0 inch of water) to about 1.49 kPa (6.0 inches of water). Plenum pressure drop across the media is preferably at least 124.5 Pa (0.5 inches of water) in order to maintain uniform laminar air flow.

Figure 7:
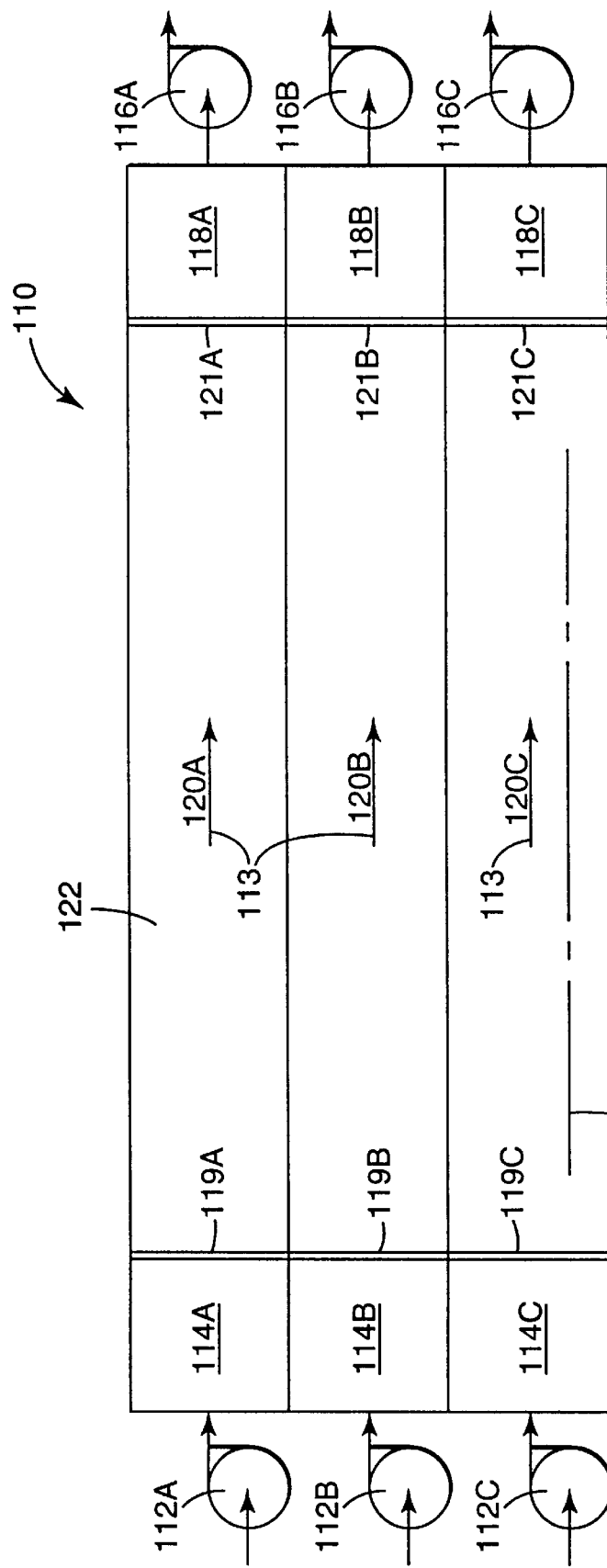
FIG. 7 is a schematic sectional view of a multi-zone drying apparatus according to the present invention.

FIG. 7 is a schematic illustration of a multi-channel low velocity laminar flow drying apparatus 110 according to the present invention. A series of supply fans 112A, 112B, 112C supply pressurized air to a series of supply plenums 114A, 114B, 114C, respectively. Similarly, a series of exhaust fans 116A, 116B, 116C create a low pressure condition in corresponding exhaust plenums 118A, 118B, 118C so as to create three separate flow channels 120A, 120B, 120C within the drying enclosure 122. Porous plates 119A–119C are preferably the same size and shape as opposing porous plates 121A–121C.

Supply fans 112A–112C and exhaust fans 116A–116C are configured to carry the greatest flow of drying gas 113 in the first flow channel 120A. The flow rates become progressively lower in the flow channels 120B and 120C. The lowest flow rate is preferably in the flow channel 120C adjacent to the web 124. The supply plenums 114A–114C are preferably identical in size and shape to the directly opposing exhaust plenums 118A–118C. The different air velocities in the flow channels 120A–120C can be produced by the use of separate variable speed fans, constant speed fans with precision dampers, porous plates with varying flow resistance such as due to varying porosities, or some combination thereof. Interfacial diffusion and/or turbulence between the flow channels 120A–120C preferably occurs far enough away from the coated web 124 to not cause surface imperfections. Table 1 sets forth exemplary plenum pressures and air velocities for in the flow channels.

TABLE 1

| Supply plenum Exhaust plenum Air velocity | Supply Plenum Pressure | Exhaust Plenum Pressure | Drying Enclosure Pressure | Flow Channel Air Velocity |
|---|---|---|---|---|
| 114A | 1.49 kPa | −1.49 kPa | 0.0 Pa | 12.3 m/min |
| 118A | (6.0 inches | (−6.0 inches | (0 inches of | (40 feet per |

TABLE 1-continued

| Supply plenum Exhaust plenum Air velocity | Supply Plenum Pressure | Exhaust Plenum Pressure | Drying Enclosure Pressure | Flow Channel Air Velocity |
|---|---|---|---|---|
| 120A | of water) | of water) | water) | min) |
| 114B | 1.25 kPa | −1.25 kPa | 0.0 Pa | 9.2 m/min |
| 118B | (5.0 inches | (−5.0 inches | (0 inches of | (30 feet per |
| 120B | of water) | of water) | water) | min) |
| 114C | 0.75 kPa | −0.75 kPa | 0.0 Pa | 6.2 m/min |
| 118C | (3.0 inches | (−3.0 inches | (0 inches of | (20 feet per |
| 120C | of water) | of water) | water) | min) |

Figure 8:
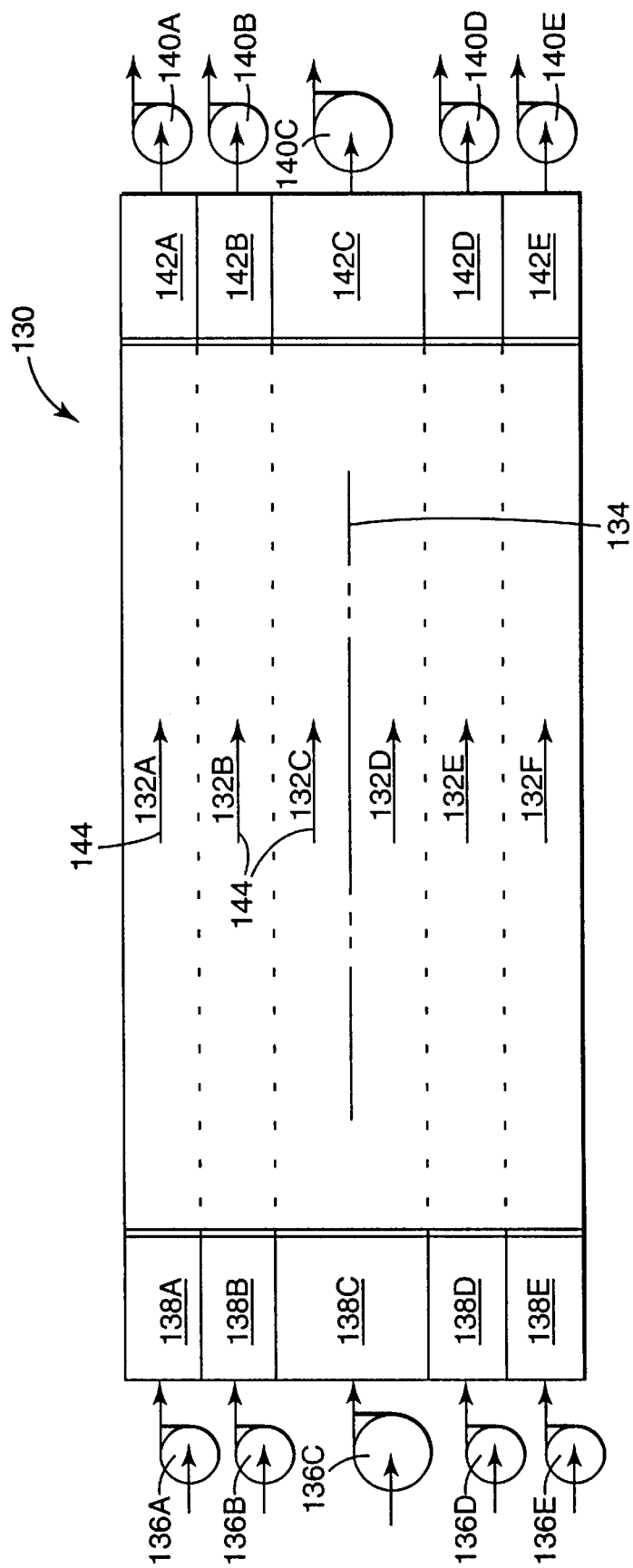
FIG. 8 is a schematic sectional view of another multi-zone drying apparatus of the present invention.

FIG. 8 is a schematic illustration of an alternate multi-channel drying apparatus 130 having a plurality of flow channels 132A through 132F located both above and below coated web 134. Supply fans 136A through 136E pressurize plenums 138A through 138E. The plenum 138C extends above and below the edge of the web 134 so that the flow rate immediately above and below the coated web 134 is substantially the same. In an alternate embodiment, it is possible to divide plenum 138C into two plenums so that different flow rates are provided above and below the web 134. Exhaust fans 140A through 140E create corresponding low pressure conditions in exhaust plenums 142A–142E. The flow channels 132C and 132D preferably have the lowest flow rate of drying gas 144. The flow channels 132B and 132E provide a slightly greater flow rate. The greatest flow rate of drying gas 144 occurs in the flow channels 132A and 132F. The multi-channel drying apparatuses 110, 130 provide improved solvent vapor diffusion and mixing into the exhaust air, resulting in accelerated dilution and potentially higher drying rates. Table 2 sets forth exemplary plenum pressures and air velocities for the flow channels.

TABLE 2

| Supply plenum Exhaust plenum Air velocity | Supply Plenum Pressure | Exhaust Plenum Pressure | Drying Enclosure Pressure | Flow Channel Air Velocity |
|---|---|---|---|---|
| 138A; 138E 142A; 142E 132A; 132F | 1.49 kPa (6.0 inches of water) | −1.49 kPa (−6.0 inches of water) | 0.0 Pa (0 inches of water) | 12.3 m/min. (40 feet per min.) |
| 138B; 138D 142B; 142D 132B; 132E | 1.25 kPa (5.0 inches of water) | −1.25 kPa (−5.0 inches of water) | 0.0 Pa (0 inches of water) | 9.2 m/min. (30 feet per min.) |
| 138C 142C 132C; 132D | 0.75 kPa (3.0 inches of water) | −0.75 kPa (−3.0 inches of water) | 0.0 Pa (0 inches of water) | 6.2 m/min. (20 feet per min.) |

Figure 9:
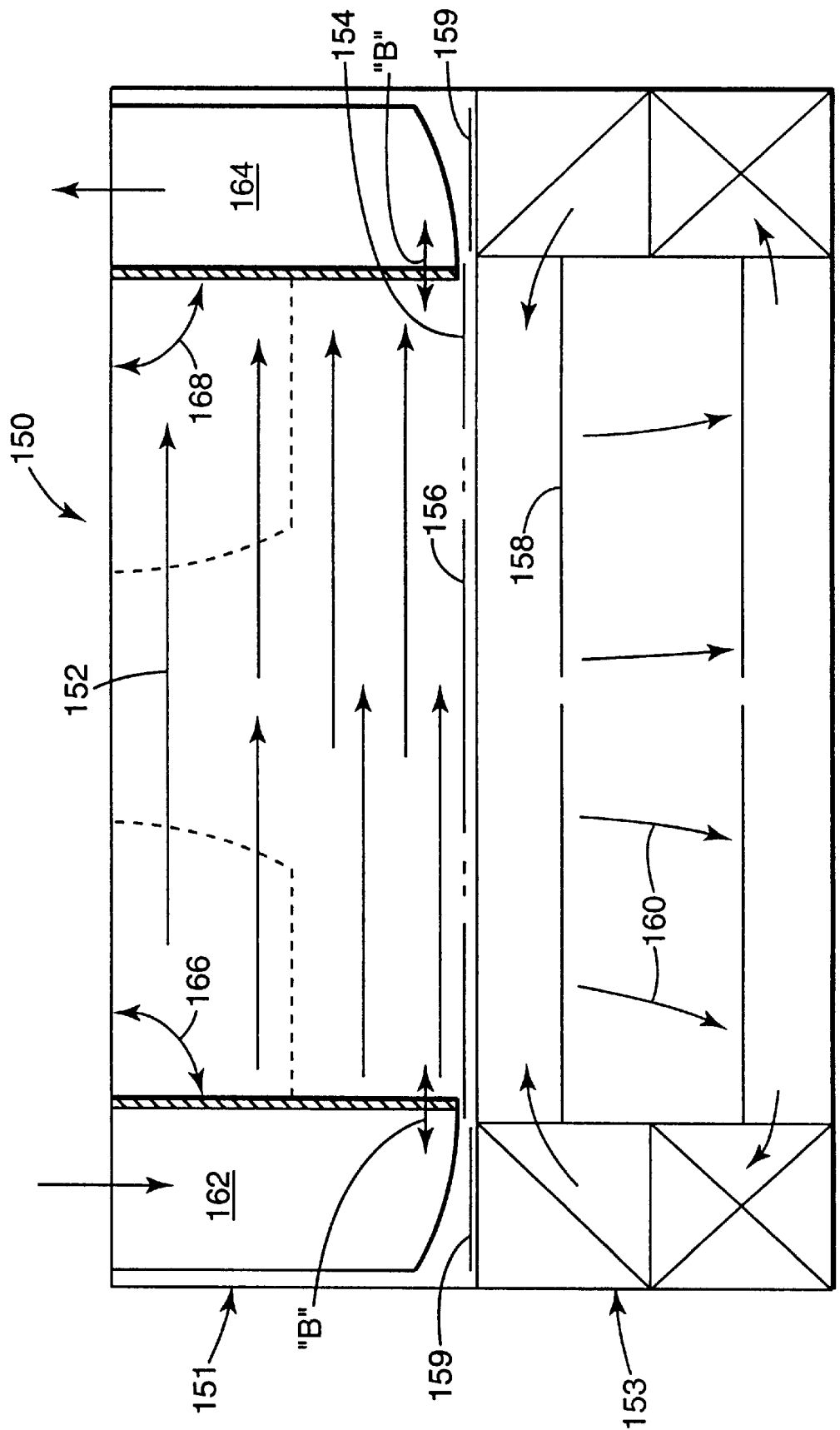
FIG. 9 is a schematic sectional illustration of an alternate drying apparatus with retractable plenums.

FIG. 9 is a schematic illustration of a two-part drying apparatus 150 utilizing low velocity laminar flow of a drying gas 152 laterally across a coated side 154 of a web 156 in an upper chamber 151. Deckle plates 159 are provided to prevent high velocity air from the lower chamber 153 from entering the upper chamber 151. Exhaust air flow 160 is directed to the lower chamber 153. Air foil bars 158, such as shown in U.S. application Ser. No. 08/624,164 filed Mar. 29, 1996, entitled Apparatus and Method for Drying a Coating on a Substrate, may be provided in the lower chamber 153 to facilitate heat transfer.

The upper chamber 151 preferably includes a retractable supply plenum 162 and a retractable exhaust plenum 164. The plenum 162 preferably rotates along a path 166 and the plenum 164 rotates along a path 168 to retracted positions. Moving the plenums 162, 164 to the retracted positions permits access to the web 156 and the deckle plates 159. The plenums 162, 164 may also be moved along axes "B" to adjust for the width of the coated web 156. Retraction of the plenum 162, 164 allows the drying apparatus 150 to be converted to a conventional co-current flow, counter-flow or impingement oven.

Figure 10:
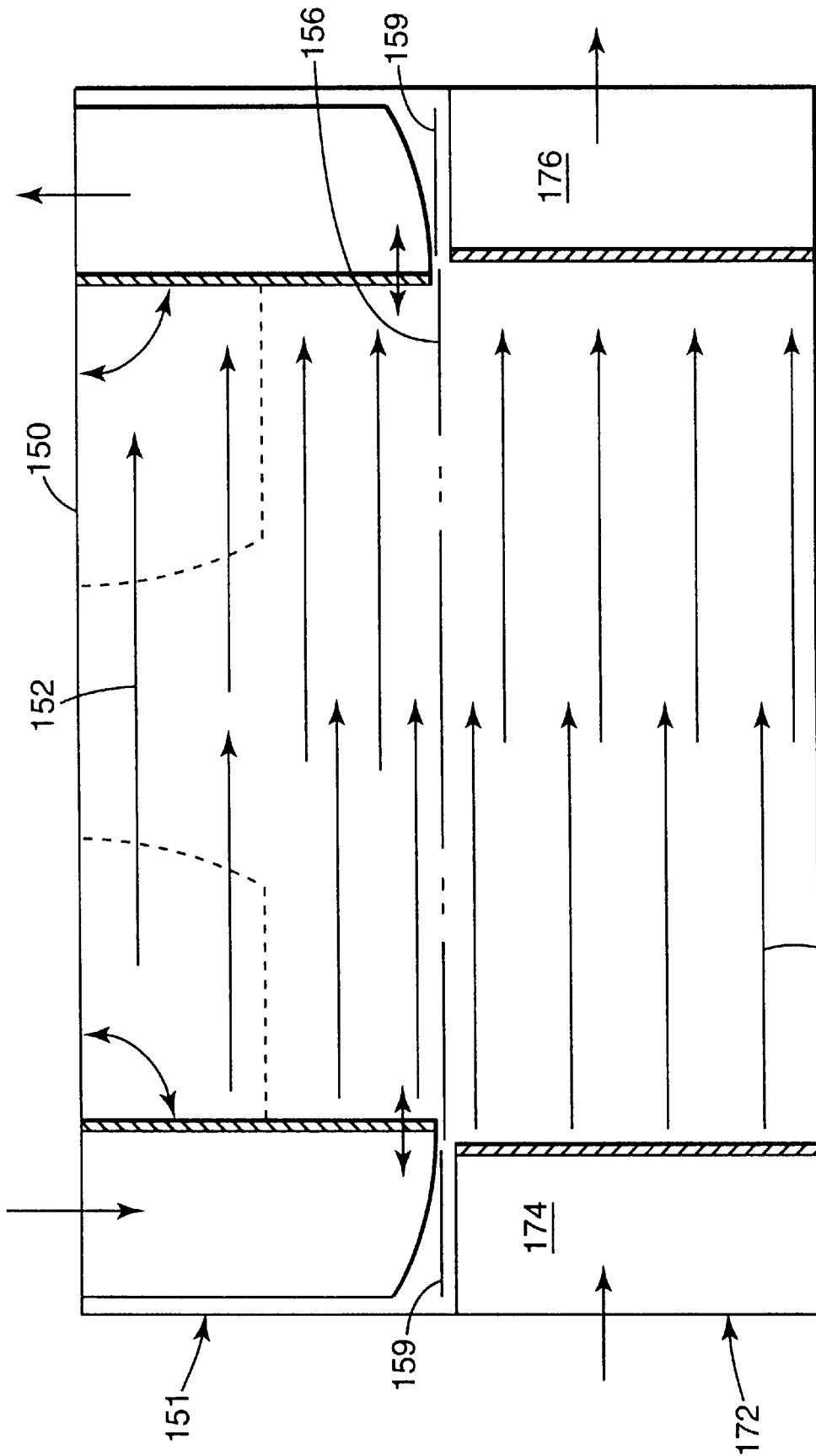
FIG. 10 is an alternate embodiment of the drying apparatus of FIG. 9.
Figure 11:
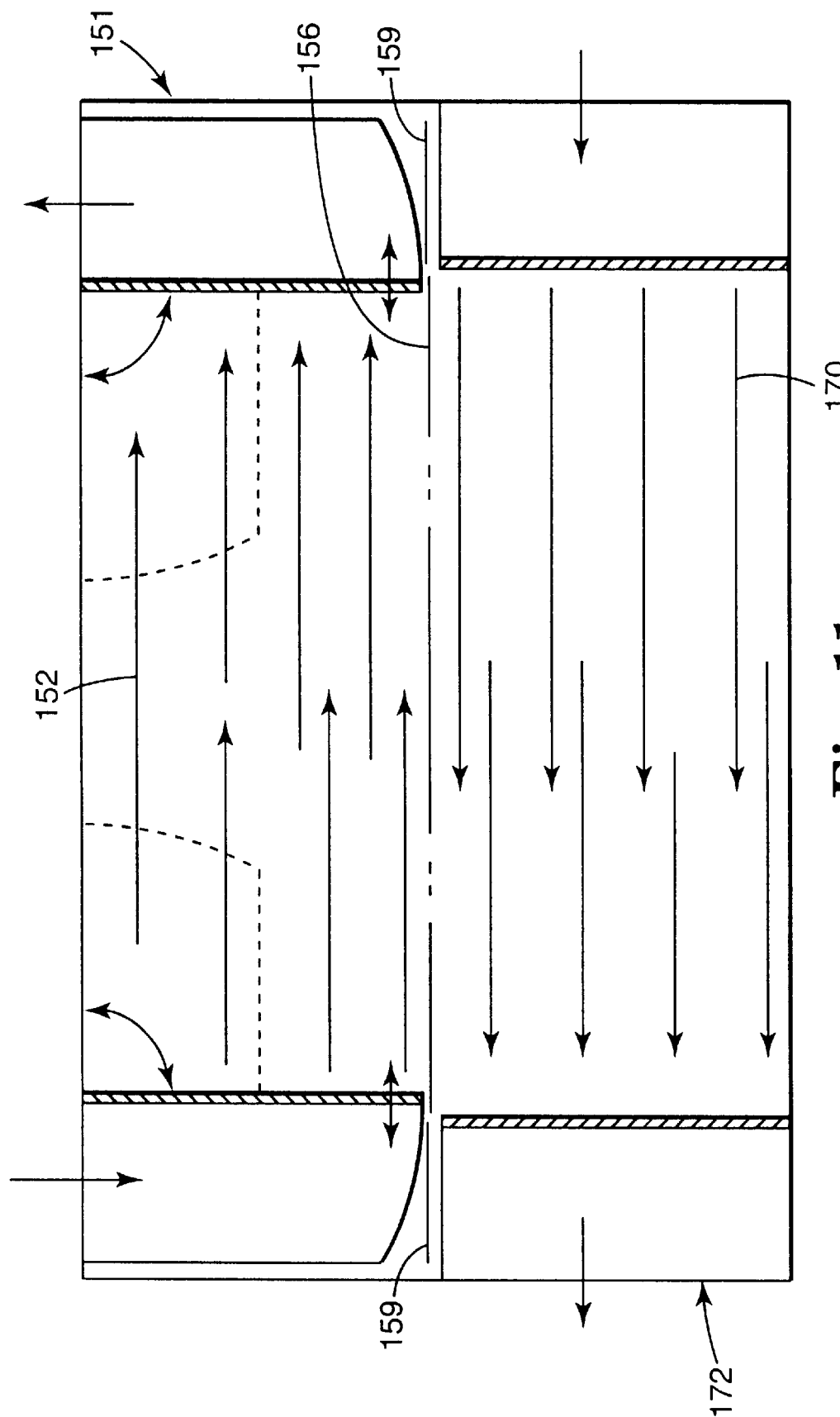
FIG. 11 is another alternate embodiment of the drying apparatus of FIG. 9.

FIG. 10 is an alternate embodiment of the two-part drying apparatus 150 in which the upper chamber 151 is substantially the same as shown in FIG. 9. The drying gas 170 is preferably in laminar flow on the uncoated side of the web. Lower chamber 172 includes a separate supply plenum 174 and exhaust plenum 176 so that increased velocity may be delivered to the uncoated side of the web 156. FIG. 11 illustrates substantially the same configuration of the drying apparatus 150 as set forth in FIG. 10 except that the drying gas 170 in lower chamber 172 is in a counter flow arrangement with the drying gas 152 of the upper chamber 151. Deckel plates 159 are provide in both embodiments to minimize air flow from the lower chamber 172 to the coated surface of the web 156.

Figure 12:
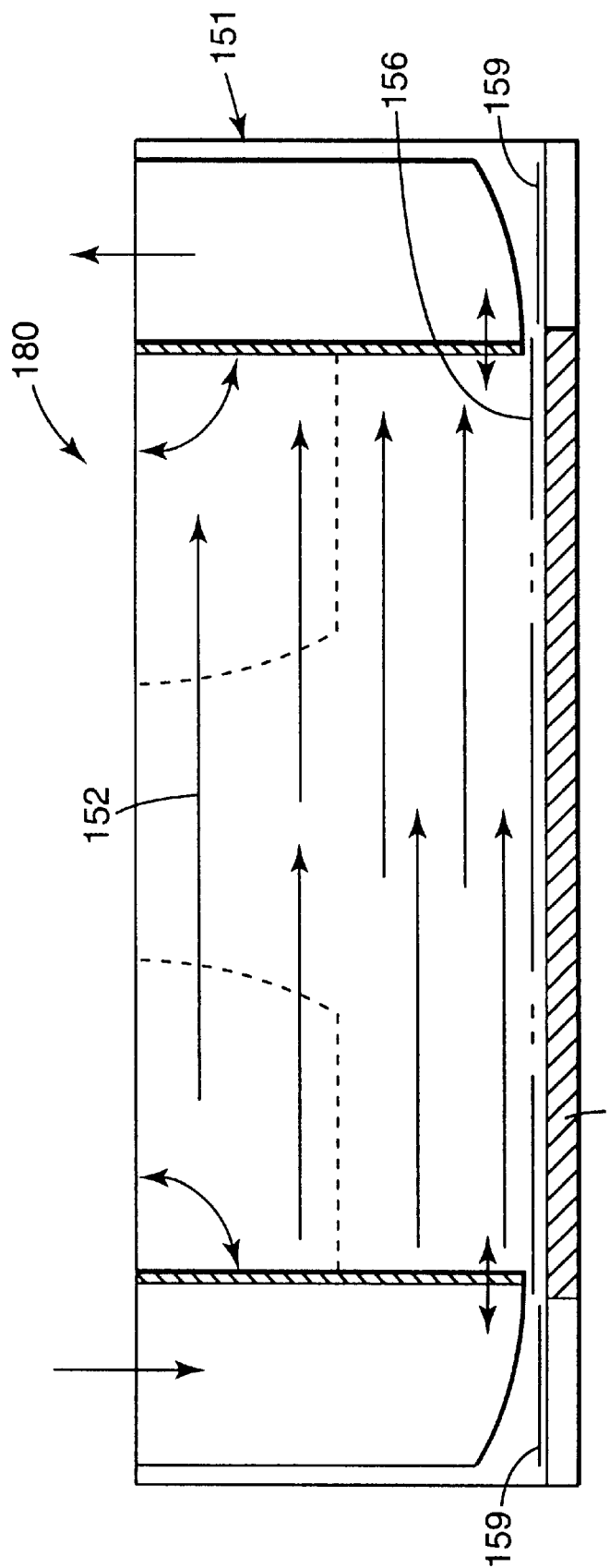
FIG. 12 is yet another alternate embodiment of the drying apparatus of FIG. 9.

FIG. 12 is a schematic illustration of an alternate two-part drying apparatus 180 where the upper chamber 151 is substantially as shown in FIG. 9. The lower chamber 153 is replaced by a radiation heating panel 182 for elevating the temperature of the uncoated side of the web 156. Deckel plates 159 are provide to minimize convective forces generated by the panel 182 to the coated surface of the web. Heating the uncoated side of the web 156 is disclosed in U.S. patent application Ser. No. 08/624,164, entitled Apparatus and Method for Drying a Coating on a Substrate.

Figure 13:
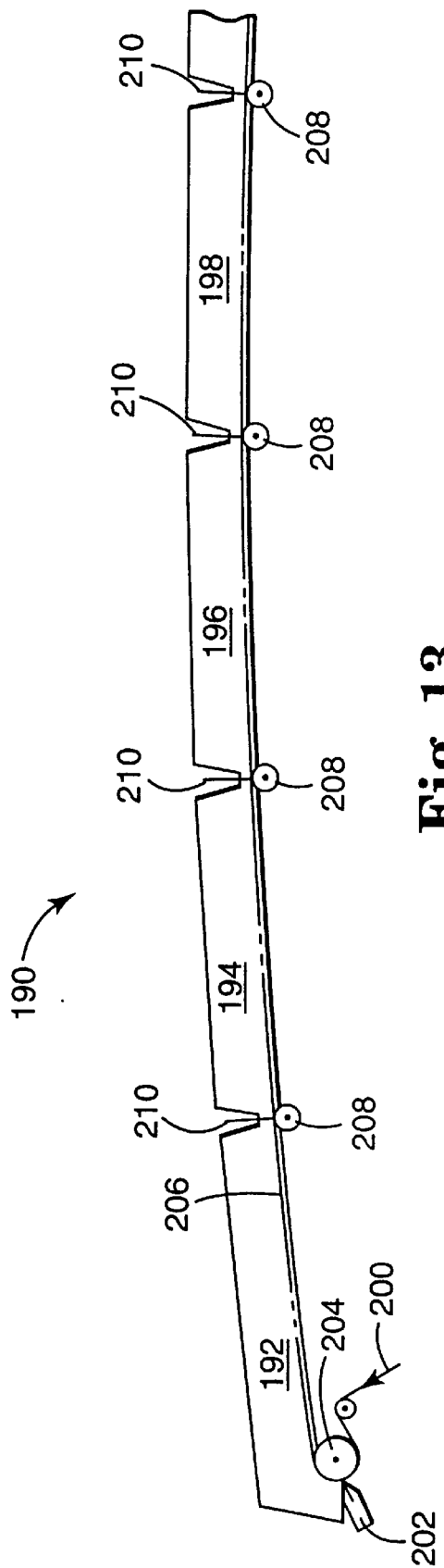
FIG. 13 is a schematic illustration of a drying system according to the present invention.

FIG. 13 is a schematic illustration of a drying system 190 utilizing a series of drying enclosures 192 through 198 of the present invention. An uncoated web 200 is delivered to a coater 202 opposite a backup roll 204 at an entrance to the drying enclosure 192. The drying enclosure 192 preferably utilizes low velocity laminar flow to dry coated web 206. An idler roll 208 supports the coated web 206 through a transitional enclosure 210 to the second drying enclosure 194. A second idler roll 208 supports the coated web 206 to a third drying enclosure 196. A third idler roll 208 supports the coated web 206 to a fourth drying enclosure 198. The transitional enclosures 210 isolate the drying enclosures 192–198 to minimize the exchange of drying gases there between or the exchange of drying gases with ambient air. Consequently, the velocity in each of the drying enclosures 192–198 may vary. The drying enclosures 192–198 preferably utilize progressively greater velocity laminar air flow to dry the coated web 206, and may utilize progressively higher temperatures of the drying gas.

For example, the drying enclosures 192 may utilize low velocity laminar flow, the drying enclosure 194 may utilize medium velocity laminar flow and the drying enclosure 196 may utilize high velocity laminar flow, substantially drying the coated web 206. Medium velocity air flow refers to air flow of about 61.5 meters/min.(200 feet/min.) to about 400 meter/min. (1300 feet/min.). High velocity air flow refers to air flow of about at least 400 meter/min. (1300 feet/min.). The transitional enclosures 210 sufficiently isolate the drying enclosures 192–198 that different drying gases may optionally be used in the drying enclosures 192–198. After the coated web 206 is dry-to-touch, a turbulent flow of drying gas may be utilized in the drying enclosure 198 to accelerate the final phases of the drying process. Increasing the temperature of the drying gas or in the oven accelerates drying, but may also increase surface imperfections. Therefore, the temperature of the drying gas or in the oven may also progressively increase as the web moves through the drying enclosures 192–198.

Figure 14B:
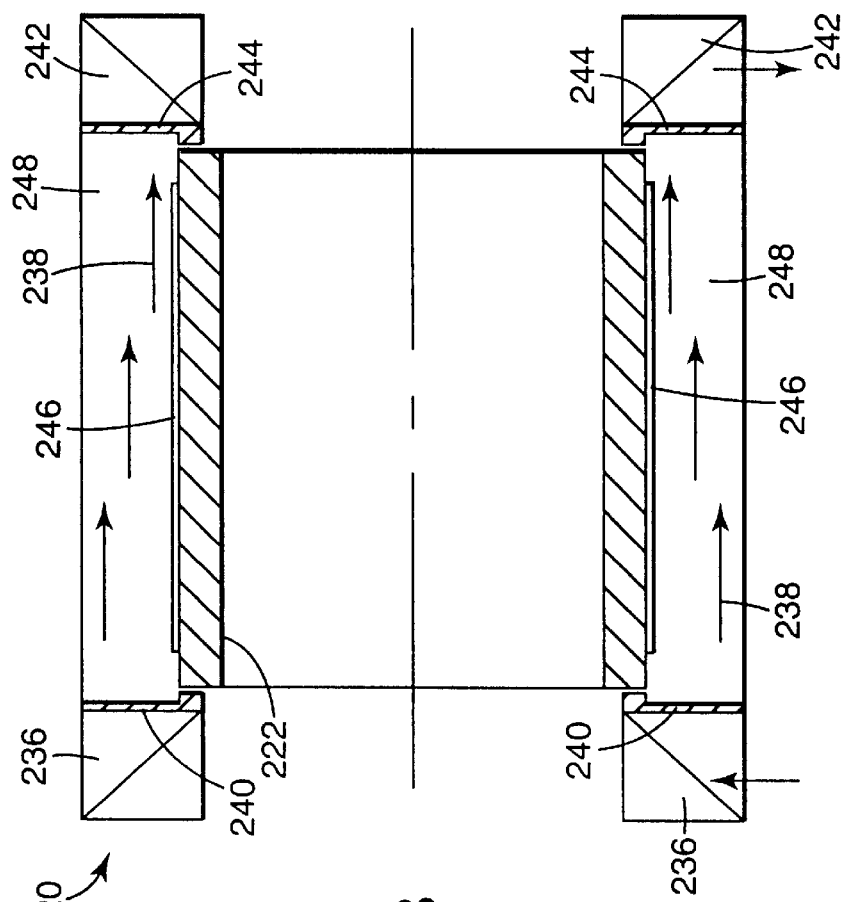
FIG. 14B is a sectional view of the drying system of FIG. 14A.
Figure 14A:
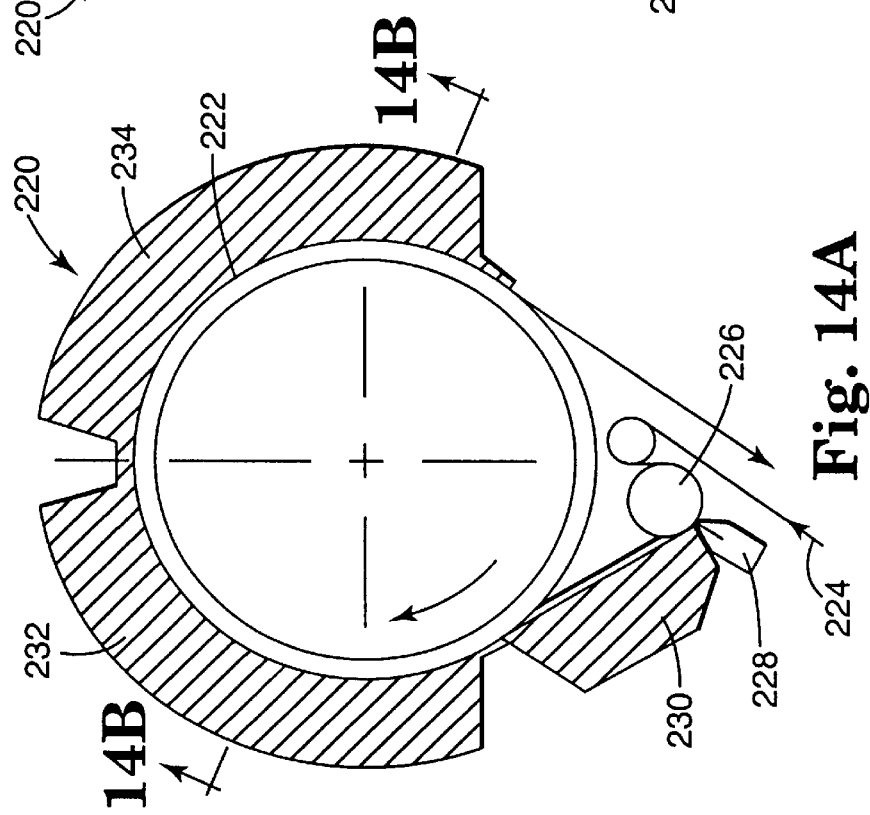
FIG. 14A is a side view of an alternate drying system configured around a rotating support roll.

FIG. 14A and 14B illustrate an alternate embodiment of a drying system 220 constructed along an arcuate path around a heated support roll 222. Uncoated web 224 is delivered to a backup roll 226 opposite a coater 228 at an entrance to a first drying apparatus 230. A second drying apparatus 232 and third drying apparatus 234 are located around the rotating support roll 222. As best seen in FIG. 14B, each drying apparatus 230–234 utilizes a pressurized supply plenum 236 that delivers a drying gas 238 through a porous plate 240. A porous plate 244 is preferably of the same size and shape as the directly opposed porous plate 240 at the other end of the drying enclosure 248. The plate 244 is in fluid communication with an exhaust plenum 242, as discussed above. The drying apparatuses 230–234 may provide the drying gas 238 in laminar flow at various velocities across the coated web 246.

Figure 15A:
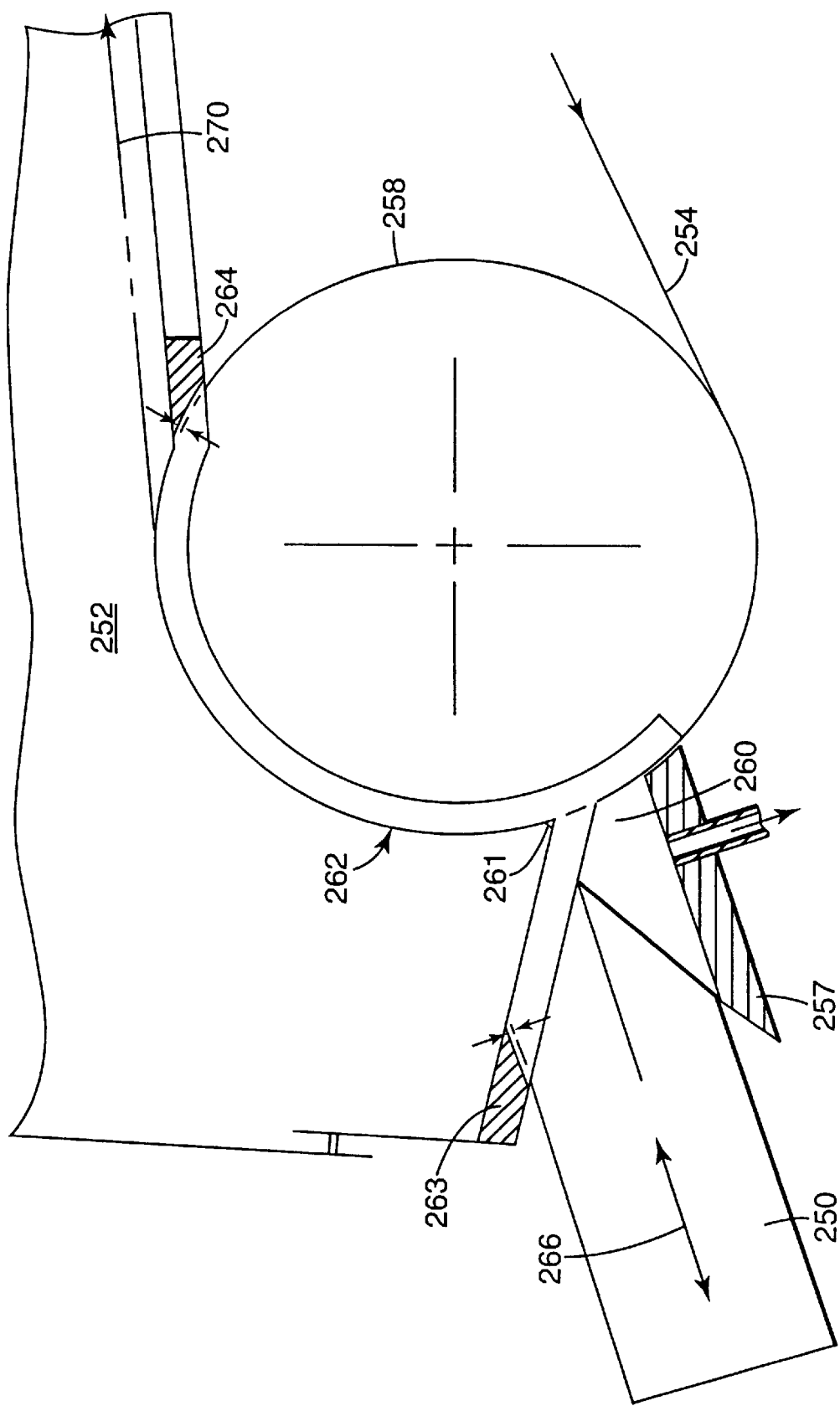
FIG. 15A is a side view of a coating die engaged with the present drying apparatus.
Figure 15B:
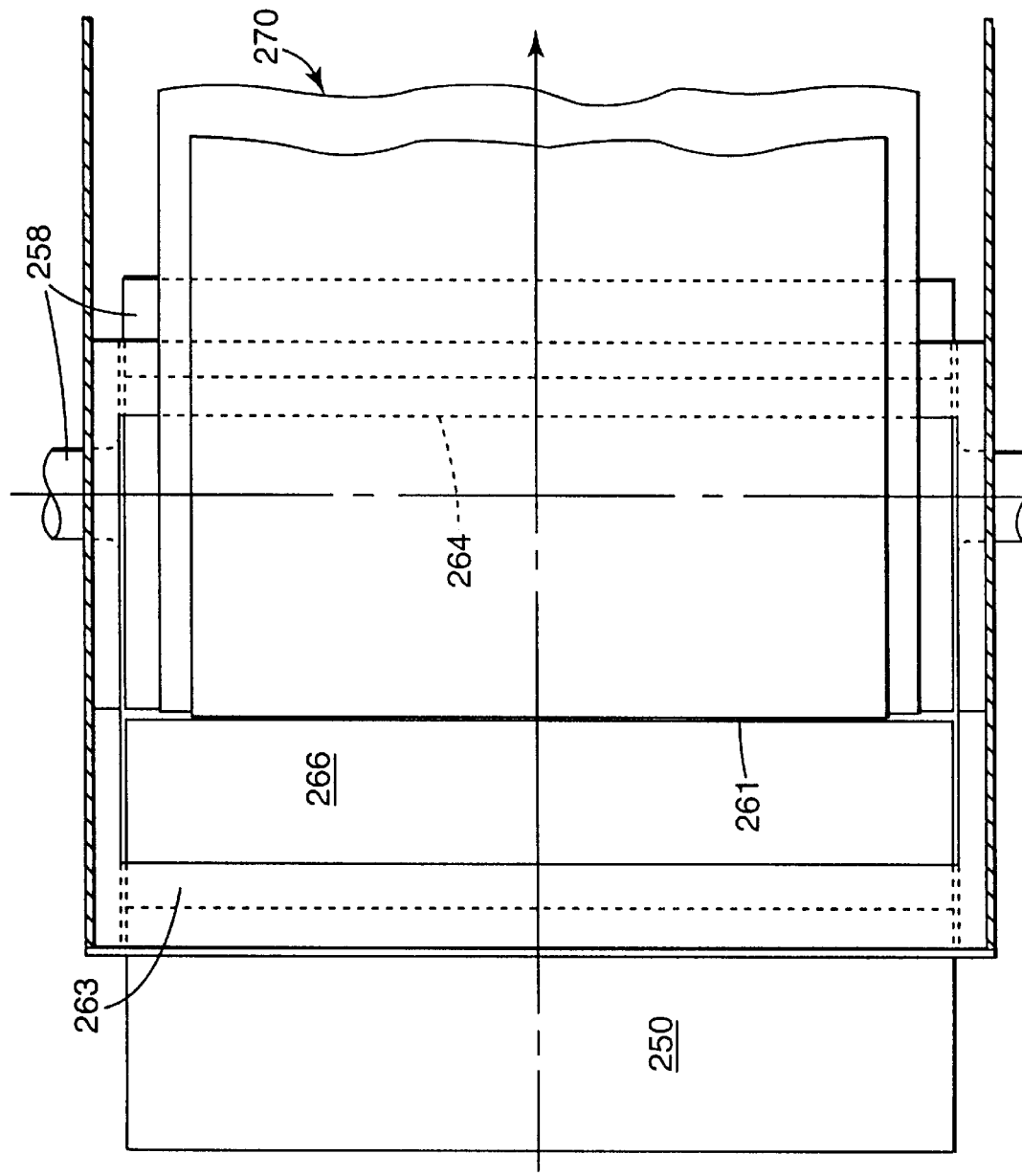
FIG. 15B is a top view of the coating die of FIG. 15A.

FIGS. 15A and 15B are schematic illustrations of a coating die 250 engaged with a drying enclosure 252 of the present invention. An uncoated web 254 is delivered from a supply roll to a backup roll 258 engaged with the coating die 250 at an entrance 260 of the drying enclosure 252. Seals 262 are located along a perimeter edge of the backup roll 258 adjacent to the drying enclosure 252. An additional seal 264 is located longitudinally across the width of the backup roll 258. The coating die 250 is preferably movable along an axis 266 so that the gap between the coating die 250 and the backup roll 258 can be adjusted. A die vacuum chamber 257 may optionally be located below the entrance 260 to facilitate coating.

The low-velocity laminar flow is preferably maintained at the coating bead area 261, where the coated web 270 is susceptible to substantial undesirable patterning. Closure member 263 is preferably flush with a top surface of the coating die 250 (with a gap of about 0.127 to 0.203 mm (0.005 to 0.008 inches)) so as to not disrupt the laminar flow near the coating bead area 261. A similar gap is maintained between the seals 262, 264 and the back up roll 258. A sealing surface of the seal 264 preferably has a radius corresponding to a radius of the backup roll 258.

Figure 16:
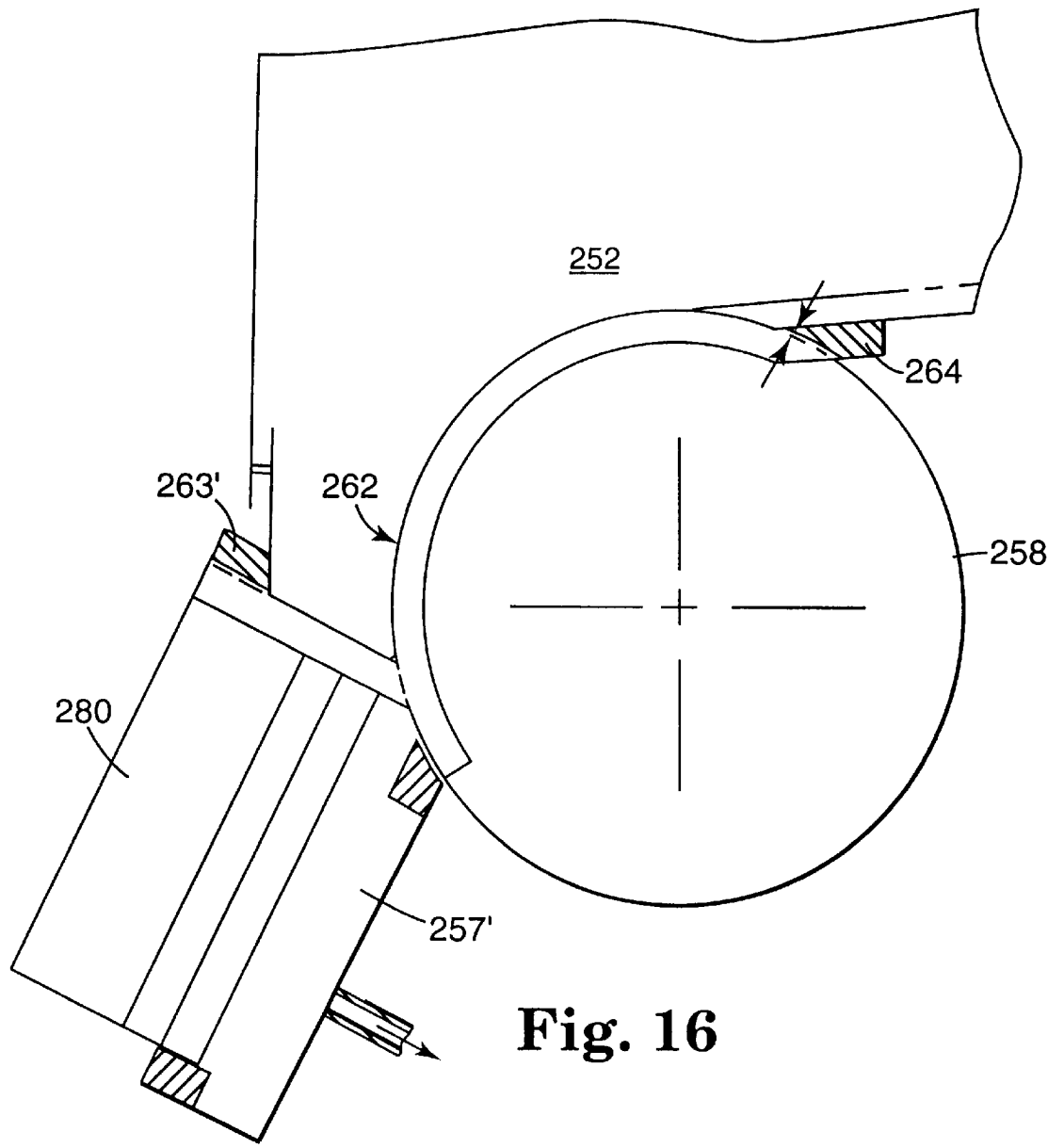
FIG. 16 is a schematic illustration of a slide coating die engaged with the present drying apparatus.

FIG. 16 is an alternate embodiment of the schematic illustration of FIG. 15 in which the coating die 250 is replaced with a slide coating die 280. The backup roll 258 preferably includes the seals 262 along the perimeter edge and the seal 264 longitudinally across the width of the backup roll 258. The gap between the slide coating die 280 and the seal 263' is preferably maintained in a range of about 0.127 to 0.203 mm (0.005 to 0.008) inches so as to isolate the die 280 from the drying enclosure 252. A similar gap is maintained between the seal 264 and the back up roll 258. A die vacuum chamber 257' may optionally be located below the entrance 260 to facilitate coating.

Figure 17A:
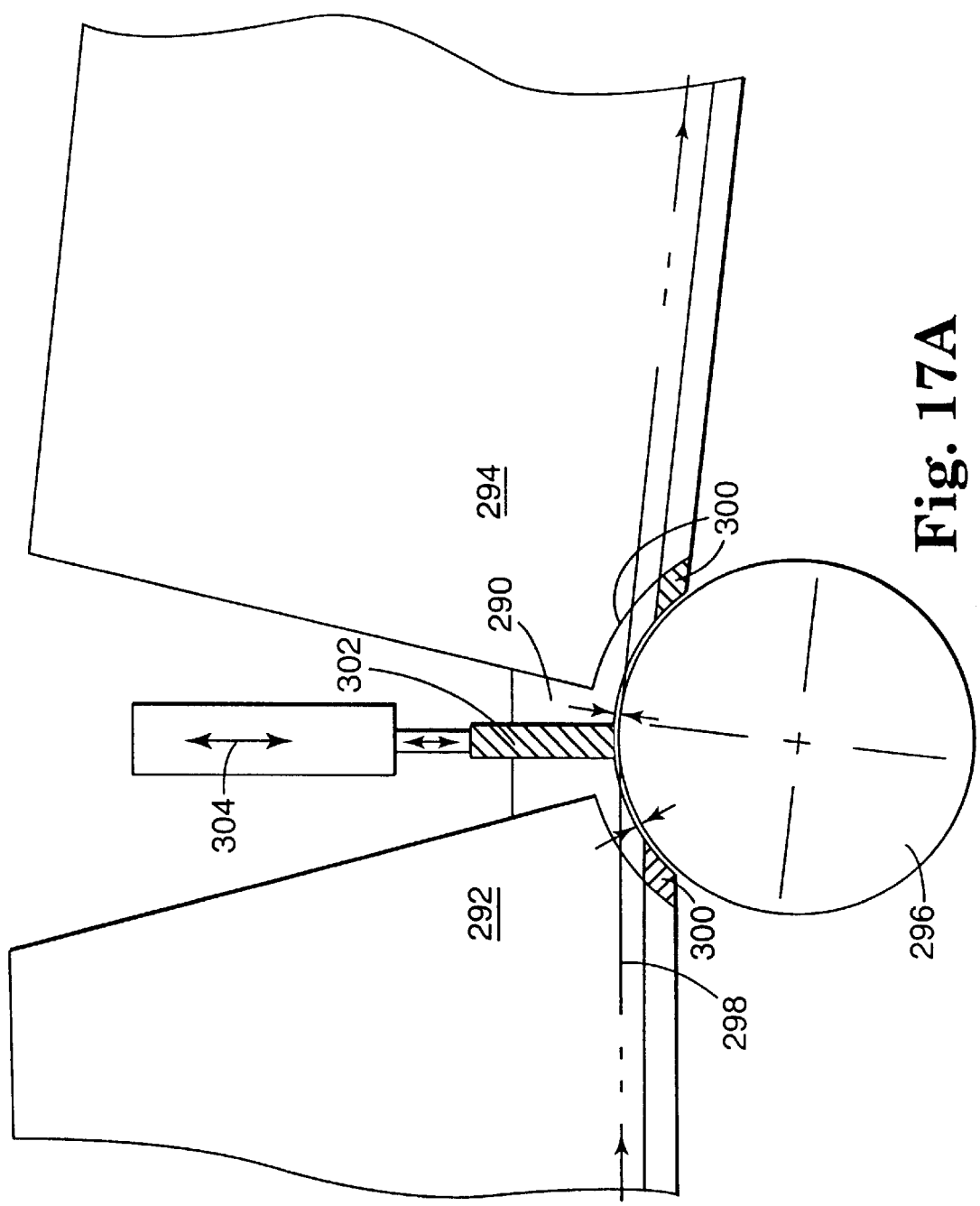
FIG. 17A is a schematic illustration of a transition enclosure used in the various embodiments of the drying system of the present invention.
Figure 17B:
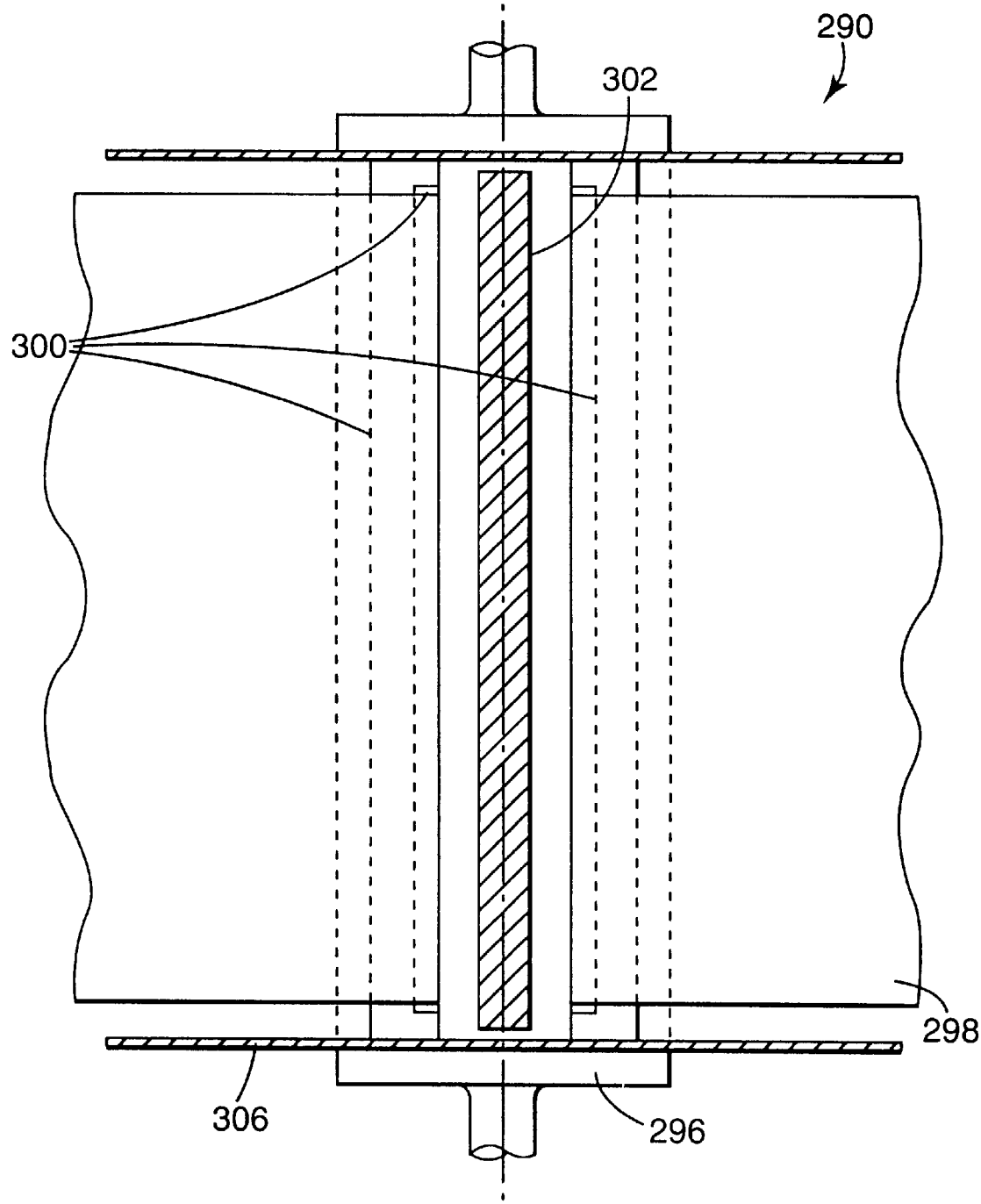
FIG. 17B is a top view of the transition enclosure of FIG. 17A.

FIGS. 17A and 17B are schematic illustrations of a transition enclosure 290 between a first drying enclosure 292 and a second drying enclosure 294, although it will be understood that the transition enclosure 290 may be used between a variety of drying devices. The transition enclosure 290 minimizes turbulent and/or high velocity interchange of drying gases and vapors along the surfaces of the web 298 and isolates the drying enclosures 292, 294 from one another. An idler roll 296 preferably supports the coated web 298 through the transition enclosure 290. Seals 300 extend across the width of the idler roll 296 to the porous plates 306 (see FIG. 17B). A retractable closure plate 302 is located immediately above the web 298 and the idler roll 296 for completing the seal between the drying enclosures 292, 294. The retractable closure plate 302 is preferably about 12.7 mm (0.5 inches) thick and can be moved along an axis 304 for adjusting a gap between the plate 302 and the coated web 298, such as to permit a seam in the web to pass through the transition enclosure 290. The seals 300 are preferably contoured or radiused to correspond to the radius of the idler roll 296. The distal end of the closure plate 302 is preferably radiused to correspond with the surface of the web 298. The gap between the coated web 298 and the closure plate 302 can be between about 0.0125 to 25.4 mm (0.001 to 1.0 inch) when not in the retracted position, and preferably in the range of about 0.025 to 0.51 mm (0.001 to 0.020 inches).

FIG. 18 is a side view of an exemplary idler roll 310 for supporting the coated web 312 in the drying apparatus 314. Seals 316 are preferably located on either side of the idler roll 310 at the bottom of the drying apparatus 314 to isolate the drying enclosure 318. Edge seals 320 are also preferably located along a portion of the perimeter of the idler roll 310. The arrangement of FIG. 18 minimizes the profile of the idler roll so that the laminar air flow is not disrupted. To the extend that the idler roll 310 protrudes into the flow field, the porous plates preferably have a radius that corresponds to the radius of the roll 310.

Figure 19A:
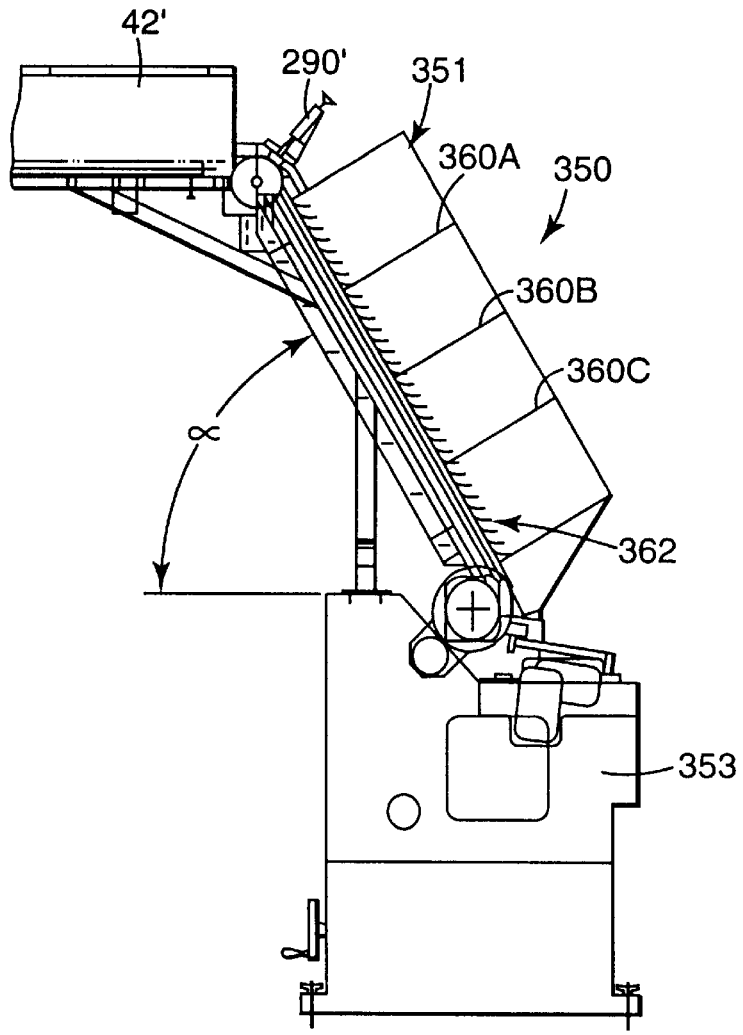
FIG. 19A is a side view of a drying apparatus according to the present invention arranged in an angled configuration.
Figure 19B:
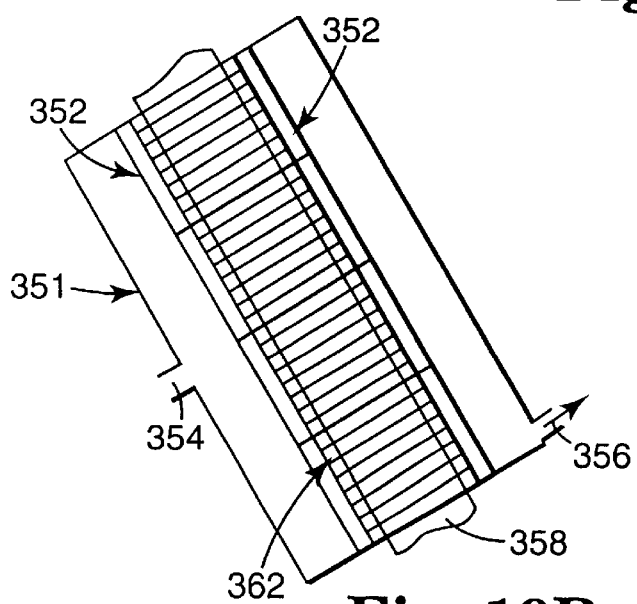
FIG. 19B is a front view of the drying apparatus of 19A.

In the embodiments discussed above, the takeoff angle of the coated web from the backup roll is typically less than 20° above horizontal. FIGS. 19A and 19B are schematic illustrations of an alternate drying apparatus 350 according to the present invention arranged in an inclined angle α of between 20° and 90° from horizontal above the coating apparatus 353. The vapor of many solvents, such as methyl ethyl ketone, are heavier than air. The evolving solvent from the coated web cascades down the incline and can cause sufficient turbulence to result in objectionable surface imperfections, a heretofore unrecognized problem in drying of coatings. Additionally, the concentration of the solvent vapors at the bottom of an inclined drying enclosure may quickly exceed the LFL safety limits, requiring a greater velocity of drying gas and potentially the formation of surface imperfections.

The drying enclosure 351 is basically as disclosed in connection with FIGS. 5A and 5B except for the inclined configuration. A transition enclosure 290' generally as illustrated in FIGS. 17A–17B is located between the drying enclosure 351 and a subsequent drying enclosure 42'. Porous plates 352 are located on either side of the web 358 in fluid communication with a supply plenum 354 and an exhaust plenum 356 so as to create low velocity laminar flow laterally across the web. Dividers 360A through 360C are preferably provided in the drying apparatus 350 to reduce the downward flow of the drying gas and to prevent a high solvent concentration zone at the bottom of the drying enclosure 351. Suspended louvers 362 are located immediately above the web 358 to direct evolving solvent vapors away from the web 358 by deflecting the vapor cascade away from the fragile coating surface, thereby reducing any surface imperfections due to cascading solvent vapors.

In an alternate embodiment, the suspended louvers 362 may be utilized without the drying enclosure 351 and/or the dividers 360A–360C. With the drying enclosure 351 and dividers 360A–360C removed, a free span of the coated web 358 is exposed to the ambient environment as it travels from the coating apparatus 353 to the transition enclosure 290' or the subsequent drying enclosure 42'. It will be understood that the suspended louvers 362 and/or dividers 360A–360C may be utilized anywhere that the coated web is at an angle other than horizontal, such as in a conventional drying oven (see FIGS. 1–4) or between the coater die and the entrance to the oven.

EXAMPLES

The Kral scale (Ku), set forth in table 1 below, is typically used to subjectively evaluate coated samples for the level of severity of drying mottle patterns.

| Grade | Grade Description |
|---|---|
| 0 Ku | Perfect. Could not be better. No perceptible evidence of undesired condition or defect. |
| 1.0 Ku | Nearly perfect. The undesired condition or defect is barely perceptible. Almost perfect quality. |
| 2.0 Ku | Good. Defect or undesired condition is present. Definitely acceptable for recommended applications. |
| 3.0 Ku | Barely acceptable for sale. Some accounts may complain about the defect or undesired condition. |
| 4.0 Ku | Barely rejectable. The defect or undesired condition is too prevalent. |
| 5.0 | Bad. The defect or undesired condition is severe. Would definitely result in complaints. |
| 6 Ku | Very bad. The undesired condition or defect is extremely severe. |

Example 1

Conventional Inclined Oven

A coating used in the construction of Matchprint II Brand Positive Black color proofing product and described in U.S. Pat. No. 4,889,787, available from Imation Corp. of St. Paul, Minn., was coated at a thickness of 0.0093 cm (0.000365 inches) wet at a rate of 30.8 meters/min. (100 ft/min.) and dried using the conventional impingement oven such as shown in FIG. 4 with the air foils on the back side of the web and impingement bars on the face side of the web. The oven was arranged in an inclined configuration of 60 degrees. The web was a 0.051 mm (0.002 inch) thick polyester film. The color coating contained 11.6% solids and had a viscosity of 1.6 cps. The solvent was methyl ethyl ketone (MEK). The face side bars were located about 22.9 cm (9 inches) from the web and had a plenum supply pressure of about 24.9 to 49.8 Pa (0.1 to 0.2 inches of water). The backside airfoils had a supply pressure of about 124.5 to 249.1 Pa (0.5 to 1.0 inches of water). The oven temperature was about 21.1 to 26.7° C. (70 to 80° F.). The coating dried in the oven exhibited an unacceptable Ku of 6 for mottle apparently caused by the cascade of solvent vapor over the surface of the web on the inclined section and the uncontrolled turbulent air flow in the oven.

Example 2

Low Velocity Laminar Flow

The black proofing color coating and web of Example 1 were coated and dried in an oven substantially as shown in FIG. 5B. The oven was inclined at an angle of less than 20 degrees from horizontal. The laminar cross web air flow in the drying enclosure 351 was less than 9.2 meters/min. (30 ft/min.) to remove the solvent vapor and to keep the oven at a safe % LFL (Lower Flammability Limit). The resulting coating had a Ku of 1.5.

Example 3

Low Velocity Laminar Flow

The black proofing color coating and web of Example 1 were coated and dried in an oven substantially as shown in FIG. 19A without louvers 362, dividers 360A–360C or the transition enclosure 290'. The incline angle was 60 degrees from horizontal. The laminar cross web air flow in the drying enclosure was about 2.5 meters/min. (8 ft/min.) to remove the solvent vapor and to keep the oven at a safe % LFL (Lower Flammability Limit). The resulting coating had a Ku of 4.5 due to solvent cascade on the inclined section.

Example 4

Low Velocity Laminar Flow with Louvers

The black proofing color coating and web of Example 1 were coated and dried in an oven substantially as shown in FIG. 19A with the louvers 362, but without the dividers 360A–360C or the transition enclosure 290'. The incline angle of the oven was about 60 degrees from horizontal. The 25.4 mm (1.0 inch) louvers were suspended about 6.35 mm (0.25 inches) above the web and arranged at an angle of 36 degrees from horizontal. The laminar cross web air flow in the drying enclosure 351 was about 2.5 meters/min. (8 ft/min.) to remove the solvent vapor and to keep the oven at a safe % LFL. The resulting coating had a Ku of 1.5 and the effect of the solvent vapor cascade was reduced or eliminated.

Example 5

The black proofing color coating and web of Example 1 were coated and dried in an oven substantially as shown in FIG. 19A with the louvers 362 and the transition enclosure 290', but without the dividers 360A–360C. The incline angle of the oven was about 60 degrees from horizontal. The laminar cross web air flow in the drying enclosure 351 was less than 4.6 meters/min. (15 ft/min.) to remove the solvent vapor and to keep the oven at a safe % LFL. The transition enclosure 290' isolated the oven zones and imparted no surface imperfections in the coating.

Patents and patent applications disclosed herein are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for drying a coating sensitive to surface imperfections on a substrate of magnetic recording materials or imaging articles comprising the steps of:

applying the coating onto a front surface of the substrate;

moving the substrate through a first drying enclosure along a first axis, the first drying enclosure being substantially isolated from an external environment; and directing a first low velocity, substantially laminar flow field of a drying gas across the front surface of the substrate, the first flow field being generally parallel to the front surface and generally perpendicular to the first axis to minimize the formation of surface imperfections in the coating during evaporation of a coating solvent.

2. The method of claim 1 wherein the step of applying the coating to the substrate comprises the step of applying the coating to the substrate within the drying enclosure.

3. The method of claim 1 wherein the step of applying the coating to the substrate comprises the step of applying a coating bead to the substrate, the coating bead forming a seal at an entrance to the drying enclosure.

4. The method of claim 1 further comprising the steps of:

moving the substrate through a second drying enclosure along a second axis;

minimizing the flow of drying gases between the first and second drying enclosures; and directing a second low velocity, substantially laminar flow field of a drying gas across the front surface of the substrate, the second flow field being generally parallel to the front surface and generally perpendicular to the second axis to minimize the formation of surface imperfections during the evaporation of the coating solvent.

5. The method of claim 4 wherein the first flow field comprises a first drying gas velocity having a first temperature and the second flow field comprises a second drying gas velocity having a second temperature, the first drying gas velocity being less than the second drying gas velocity.

6. The method of claim 5 wherein the first temperature is less than the second temperature.

7. The method of claim 5 further comprising the steps of:

moving the substrate to a third drying enclosure along a third axis;

minimizing the flow of drying gases between the second and third drying enclosures; and directing a third low velocity, substantially laminar flow field of a drying gas across the front surface of the substrate, the third flow field being generally parallel to the front surface and generally perpendicular to the third axis to minimize the formation of surface imperfections during the evaporation of the coating solvent.

8. The method of claim 7 wherein the second flow field comprises a second drying gas velocity and the third flow field comprises a third drying gas velocity having a third temperature, the second drying gas velocity being less than the third drying gas velocity.

9. The method of claim 8 wherein the second temperature is less than the third temperature.

10. The method of claim 1 further comprising the step of configuring the first drying enclosure so that the first axis defines an arcuate path along an outer surface of a support roll.

11. The method of claim 1 further comprising the steps of:

configuring the first drying enclosure so that the first axis defines an inclined configuration with respect to horizontal; and providing means for directing solvent vapors evaporating from the coating solvent distally away from the first surface of the substrate.

12. The method of claim 11 further comprising the step of positioning dividers in the drying enclosure substantially perpendicular to the first axis for maintaining the flow field generally perpendicular to the first axis.

13. The method of claim 1 wherein the coating solvent is flammable and the step of directing a low velocity flow field across the substrate comprises the step of directing the drying gas at a velocity sufficient to maintain a solvent vapor concentration within the first drying enclosure at less than 25% of a lower flammability limit.

14. The method of claim 1 wherein the step of directing a flow field of a drying gas comprises the steps of:

locating a first porous media forming a surface of a supply plenum within the drying enclosure along a first edge of the substrate, the first porous media being generally parallel to the first axis and generally perpendicular to the substrate;

locating a second porous media forming a surface of an exhaust plenum within the drying enclosure along a second edge of the substrate and generally parallel to the first porous substrate;

increasing the pressure in the supply plenum above ambient pressure; and decreasing the pressure in the exhaust plenum below ambient pressure.

15. The method of claim 14 further comprising the step of generating a pressure drop across the first porous media generally equal to a pressure drop across the second porous media.

16. The method of claim 14 wherein the porous media comprises a sintered metal.

17. The method of claim 14 further comprising the step of pivotally mounting the supply plenum and exhaust plenum within the first drying enclosure.

18. The method of claim 1 wherein the step of directing a first flow field comprises the step of dividing the first flow field into a first flow channel directed across the front surface of the substrate and a second flow channel parallel to the first flow channel.

19. The method of claim 18 further comprising the step of directing the second flow channel in substantially laminar flow along a boundary of the first flow channel.

20. The method of claim 18 further comprising the step of directing the second flow channel in substantially laminar flow along a rear surface of the substrate.

21. The method of claim 18 further comprising the step of directing the second flow channel in substantially laminar flow along a rear surface of the substrate in a direction opposite to the first flow channel.

22. The method of claim 18 further comprising the step of directing the second flow channel in turbulent flow along a rear surface of the substrate.

23. The method of claim 18 further comprising the step of dividing the first flow channel into a plurality of flow channels layered parallel with the front surface of the substrate.

24. The method of claim 18 further comprising the step of dividing the second flow channel into a plurality of flow channels layered parallel with the front surface of the substrate.

25. The method of claim 18 wherein first flow channel comprises a first drying gas velocity and the second flow channel comprises a second drying gas velocity, the first drying gas velocity being less than the second drying gas velocity.

26. The method of claim 1 further comprising positioning a radiant heat source in the drying enclosure adjacent to a rear surface of the substrate.

27. The method of claim 1 wherein the step of moving the substrate comprises the step of moving the substrate at a rate of at least 30.8 meters/min. (100 fpm).

* * * * *